United States Patent
Katayama et al.

(10) Patent No.: US 8,942,025 B2
(45) Date of Patent: *Jan. 27, 2015

(54) VARIABLE RESISTANCE NONVOLATILE MEMORY ELEMENT WRITING METHOD

(75) Inventors: Koji Katayama, Nara (JP); Satoru Mitani, Osaka (JP); Takeshi Takagi, Kyoto (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 144 days.

This patent is subject to a terminal disclaimer.

(21) Appl. No.: 13/809,175

(22) PCT Filed: Aug. 9, 2012

(86) PCT No.: PCT/JP2012/005068
§ 371 (c)(1),
(2), (4) Date: Jan. 9, 2013

(87) PCT Pub. No.: WO2013/021649
PCT Pub. Date: Feb. 14, 2013

(65) Prior Publication Data
US 2013/0242642 A1 Sep. 19, 2013

(30) Foreign Application Priority Data
Aug. 10, 2011 (JP) .................. 2011-175411

(51) Int. Cl.
*G11C 11/00* (2006.01)
*G11C 13/00* (2006.01)
(52) U.S. Cl.
CPC ............ *G11C 13/0069* (2013.01); *G11C 13/00* (2013.01)
USPC .......................................... 365/148; 365/163
(58) Field of Classification Search
CPC ........................ G11C 13/0069; G11C 13/0004
USPC .................................................. 365/148, 163
See application file for complete search history.

(56) References Cited

U.S. PATENT DOCUMENTS 7,289,351 B1 10/2007 Chen et al.
8,432,721 B2 * 4/2013 Iijima et al. .................. 365/148
(Continued)

FOREIGN PATENT DOCUMENTS

CN 102067234 A 5/2011
JP 2007-004935 1/2007
(Continued)

OTHER PUBLICATIONS

International Search Report issued Sep. 11, 2012 in International (PCT) Application No. PCT/JP2012/005068.
(Continued)

*Primary Examiner* — Huan Hoang
(74) *Attorney, Agent, or Firm* — Wenderoth, Lind & Ponack, L.L.P.

(57) ABSTRACT

A variable resistance nonvolatile memory element writing method according to the present disclosure includes: (a) changing a variable resistance layer to a low resistance state by applying, to a second electrode, a first voltage which is negative with respect to a first electrode; and (b) changing the variable resistance layer to a high resistance state. Step (b) includes: (i) applying, to the second electrode, a second voltage which is positive with respect to the first electrode; and (ii) changing the variable resistance layer to the high resistance state by applying, to the second electrode, a third voltage, which is negative with respect to the first electrode and is smaller than the absolute value of a threshold voltage for changing the variable resistance layer from the high resistance state to the low resistance state, after the positive second voltage is applied in step (i).

9 Claims, 21 Drawing Sheets

(56) References Cited

U.S. PATENT DOCUMENTS

| | | | |
|---|---|---|---|
| 8,599,602 B2 * | 12/2013 | Iijima et al. ............... | 365/148 |
| 2011/0044088 A1 | 2/2011 | Muraoka et al. | |
| 2011/0110143 A1 | 5/2011 | Kanzawa et al. | |
| 2011/0128773 A1 | 6/2011 | Azuma et al. | |
| 2011/0176351 A1 | 7/2011 | Fujitsuka et al. | |
| 2011/0310652 A1 | 12/2011 | Kim et al. | |

FOREIGN PATENT DOCUMENTS

| | | |
|---|---|---|
| JP | 4653260 | 3/2011 |
| JP | 2011-090755 | 5/2011 |
| JP | 2011-146111 | 7/2011 |
| JP | 2012-009124 | 1/2012 |
| WO | 2010/021134 | 2/2010 |
| WO | 2010/116754 | 10/2010 |
| WO | 2010/125805 | 11/2010 |

OTHER PUBLICATIONS

Chinese Office Action issued Jul. 24, 2014 in corresponding Chinese Patent Application No. 201280001911.5 with partial English translation.

* cited by examiner

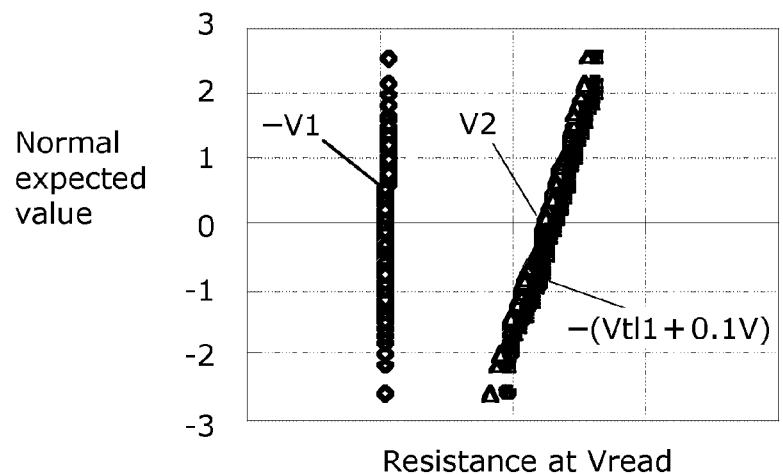
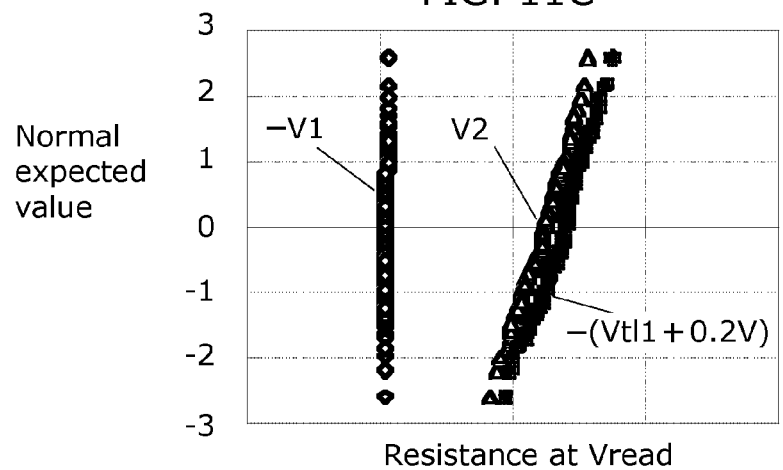
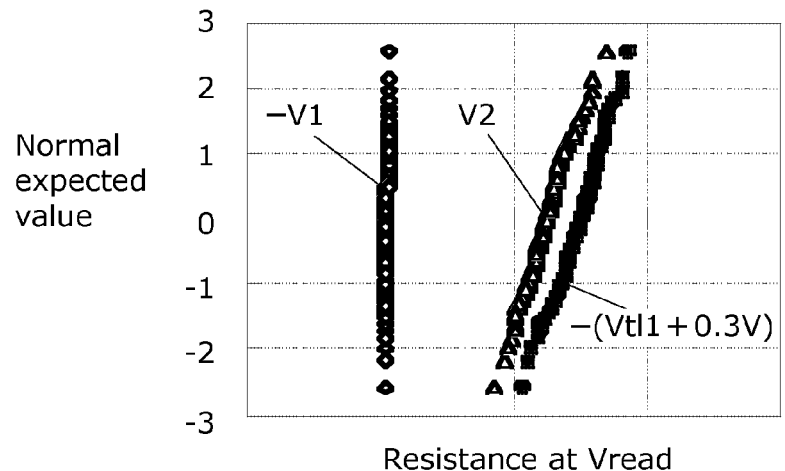

VARIABLE RESISTANCE NONVOLATILE MEMORY ELEMENT WRITING METHOD

TECHNICAL FIELD

The present invention relates to a method of writing into a variable resistance nonvolatile memory element whose resistance value reversibly changes according to an applied electrical signal.

BACKGROUND ART

In recent years, nonvolatile memory devices using a nonvolatile memory element such as a ferroelectric capacitor or variable resistance element have attracted attention as large-capacity and high-speed nonvolatile memory devices to be used in portable digital devices and the like.

Variable resistance elements include two types, namely, the unipolar (or monopolar) variable resistance element and the bipolar variable resistance element. The unipolar (or monopolar) variable resistance element has a characteristic of being able to change from the high resistance state to the low resistance state or from the low resistance state to the high resistance state according to two drive voltages of the same polarity. The bipolar variable resistance element has a characteristic of being able to change from the high resistance state to the low resistance state or from the low resistance state to the high resistance state according to two drive voltages of different polarities.

With the unipolar variable resistance element, a unidirectional diode which makes use of only the non-linear voltage-current characteristics of one voltage polarity can be used as a current control element, and thus the structure of a memory cell including a resistance element and a current control element can be simplified.

On the other hand, with the bipolar variable resistance element, a bidirectional diode which makes use of the non-linear voltage-current characteristics of both voltage polarities is typically used as a current control element. The bipolar variable resistance element has a high operating speed because the resetting operation for changing the variable resistance element to the high resistance state and the setting operation for changing the variable resistance element to the low resistance state can be performed using electric pulses of a short pulse width.

A nonvolatile memory device that is well known as a nonvolatile memory device using a variable resistance element has, arrayed in a matrix, memory cells of the so-called 1T1R type in which a MOS transistor and a variable resistance element are connected in series. For example, Patent Literature (PTL) 1 discloses a 1T1R nonvolatile memory device using a bipolar variable resistance element comprising copper oxide ($Cu_2O$).

Furthermore, a nonvolatile memory device that is well known as a nonvolatile memory device using a variable resistance element has, arrayed in a matrix, cross-point memory cells of the so-called 1D1R type in which a diode and a variable resistance element are connected in series.

CITATION LIST

Patent Literature

[PTL 1] U.S. Pat. No. 7,289,351 Specification (FIG. 2, FIG. 5, FIG. 7)

SUMMARY OF INVENTION

Technical Problem

However, the inventors have discovered the problem that variation occurs in the high resistance state in the above-described conventional nonvolatile memory devices.

The present invention is conceived in view of the aforementioned problem and has as an object to provide a variable resistance nonvolatile memory element writing method capable of suppressing variation in the high resistance state.

Solution to Problem

In order to achieve the aforementioned object, an aspect of the variable resistance nonvolatile memory element writing method according to the present invention is a variable resistance nonvolatile memory element writing method for writing data to a variable resistance nonvolatile memory element including a first electrode, a second electrode, and a variable resistance layer which is disposed between the first electrode and the second electrode, is in contact with the first electrode and the second electrode, and reversibly changes between two resistance states consisting of a high resistance state and a low resistance state, according to an electrical signal applied between the first electrode and the second electrode, the variable resistance layer having a stacked structure including: a first metal oxide layer which is in contact with the first electrode and comprises a first metal; and a second metal oxide layer which is in contact with the second electrode and comprises a second metal, and the method comprising: (a) changing the variable resistance layer to the low resistance state indicated by a resistance value RL, by applying a negative first voltage to the second electrode, the negative first voltage being negative with respect to the first electrode; and (b) changing the variable resistance layer to the high resistance state, wherein step (b) includes: (i) changing a resistance value of the variable resistance layer to a resistance value RH which is larger than the resistance value RL, by applying a positive second voltage to the second electrode, the positive second voltage being positive with respect to the first electrode; and (ii) changing the variable resistance layer to the high resistance state indicated by a resistance value RH1 which is larger than the resistance value RH, by applying a negative third voltage to the second electrode, after the positive second voltage is applied in step (i), the negative third voltage being negative with respect to the first electrode and being smaller than an absolute value of a threshold voltage for changing the variable resistance layer from the high resistance state to the low resistance state.

These general and specific aspects may be implemented using a system, a method, and an integrated circuit, or any combination of systems, methods, or integrated circuits.

Advantageous Effects of Invention

The present invention is capable of realizing a variable resistance nonvolatile memory element writing method capable of suppressing variation to the low resistance-side in the high resistance state and ensuring a maximum resistance-change window.

BRIEF DESCRIPTION OF DRAWINGS

FIG. 11B is a graph illustrating the normal expected value distribution of resistance values when the high resistance writing method according to Embodiment 1 is executed 100 times and the width of the high resistance stabilization writing voltage pulse is 100 μs.

FIG. 11C is a graph illustrating the normal expected value distribution of resistance values when the high resistance writing method according to Embodiment 1 is executed 100 times and the width of the high resistance stabilization writing voltage pulse is 100 μs.

FIG. 11D is a graph illustrating the normal expected value distribution of resistance values when the high resistance writing method according to Embodiment 1 is executed 100 times and the width of the high resistance stabilization writing voltage pulse is 100 μs.

DESCRIPTION OF EMBODIMENTS (Circumstances Leading to an Aspect of the Present Invention)

With regard to the conventional semiconductor element writing method, the inventors have found the problem that, in the high resistance-change writing for changing the resistance value from the low resistance state to the high resistance state (hereafter also referred to as high resistance writing), there are instances in which the resistance state remains at an insufficient high resistance state.

The circumstances leading to this finding shall be described below.

Figure 17:
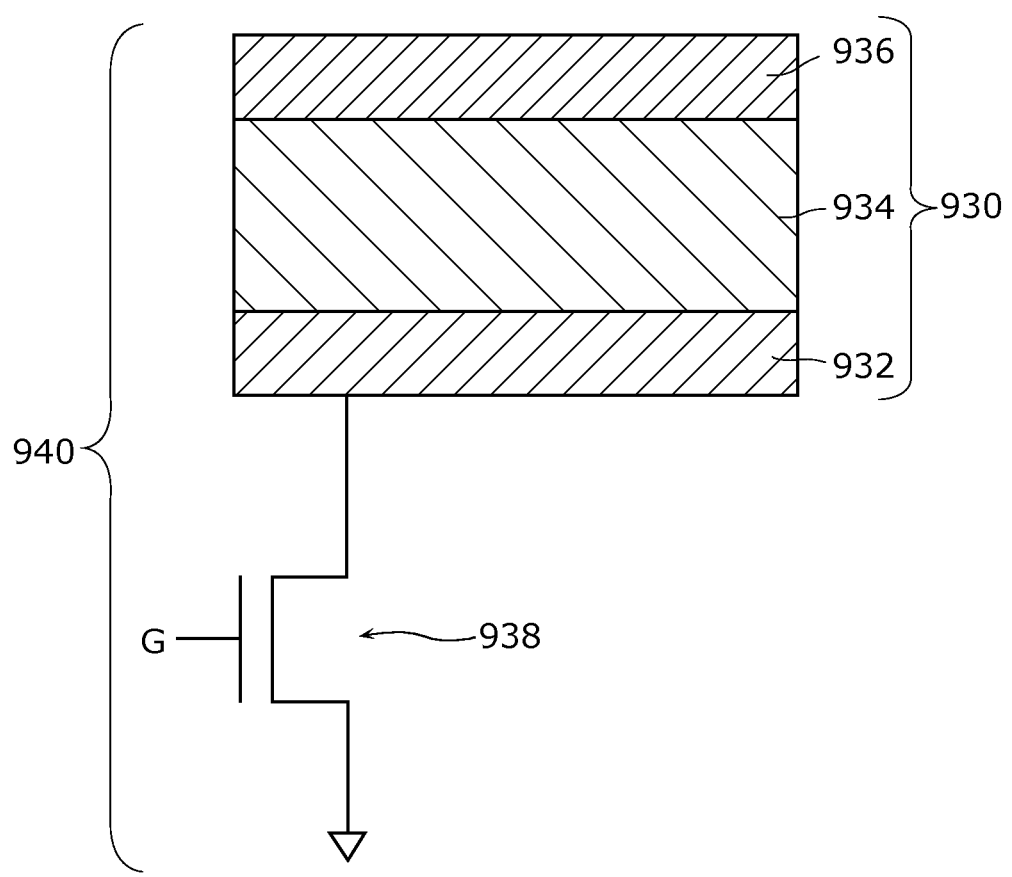
FIG. 17 is a main section cross-sectional view showing the structure of a conventional nonvolatile memory element.

FIG. 17 shows the configuration of a 1T1R nonvolatile memory element using a bipolar variable resistance element, which is a configuration of a conventional nonvolatile memory element.

A nonvolatile memory element 940 shown in FIG. 17 includes a variable resistance element 930 and a MOS transistor 938.

A nonvolatile memory element 940 shown in FIG. 17 includes a variable resistance element 930 and a MOS transistor 938. The variable resistance element 930 and the MOS transistor 938 are connected electrically in series.

The variable resistance element 930 includes a first electrode 936, a second electrode 932, and a variable resistance layer 934. The variable resistance layer 934 is configured by being interposed between the first electrode 936 and the second electrode 932.

The conventional method of writing to the nonvolatile memory element 940 configured in the above manner is as follows.

Specifically, of the drain and source terminals of the MOS transistor 938, the terminal (for example the source terminal) that is not connected to the variable resistance element 930 is set to a reference voltage (ground), and a positive voltage is applied to the first electrode 936 so that a low resistance writing voltage is applied to the variable resistance element 930, when the resistance value of the variable resistance element 930 is in the high resistance state. With this, the resistance value of the variable resistance element 930 changes from the high resistance state to the low resistance state, and the resistance value of the nonvolatile memory element 940 changes to the low resistance state.

On the other hand, when a high resistance writing voltage by which current flows from the second electrode 932 towards the first electrode 936 is applied to the variable resistance element 930 when the resistance value of the variable resistance element 930 is in the low resistance state, the resistance value of the variable resistance element 930 changes from the low resistance state to the high resistance state, and the resistance value of the nonvolatile memory element 940 changes to the high resistance state.

However, with the conventional semiconductor element writing method, there is the problem that variation occurs in the high resistance state, that is, there is the problem that, in the high resistance writing for changing the resistance value from the low resistance state to the high resistance state, there are instances in which the resistance state remains at an insufficient high resistance state. This problem shall be described below.

The inventors studied a bipolar type variable resistance nonvolatile memory device having a variable resistance layer comprising an oxygen-deficient oxide of a transition metal such as tantalum or hafnium. Here, an oxygen-deficient oxide refers to an oxide that is oxygen-deficient compared to its stoichiometric composition. Most metal oxides of a stoichiometric composition exhibit insulating properties. However, by adopting the oxygen-deficient type, a metal oxide shows semiconducting or conducting properties.

Writing was performed on the oxygen-deficient oxide of the transition metal using the conventional writing method. Specifically, a positive voltage write pulse is applied when changing, to the high resistance state, a memory cell including a variable resistance layer comprising the oxygen-deficient oxide of the transition metal, and a negative voltage write pulse is applied when changing to the low resistance state.

Then, in the high resistance writing for changing from the low resistance state to the high resistance state, there are instances where the resistance value of the high resistance state does not become a predetermined resistance value and instead shifts to a resistance side that is lower than the predetermined resistance value. It should be noted that the resistance state that remains at such an insufficient high resistance state shall be called a sub-high resistance state.

In such a case where the high resistance state becomes a sub-high resistance state described above (i.e., shifts to a resistance side lower than the predetermined resistance value) after the high resistance writing, the reading window, which is the resistance difference between the high resistance state and the low resistance state, becomes small in a variable resistance nonvolatile memory device provided with plural memory cells. Specifically, in such a case, it is possible to have deterioration of characteristics or operational malfunctions such as deterioration of reading speed, losing the reading window due to resistance state variation, and inability to perform reading.

Furthermore, causing the variable resistance nonvolatile memory device to operate on the high resistance-side (low current-side) as much as possible allows power consumption to be reduced.

An aspect of the present disclosure was conceived in view of the foregoing circumstances and has as an object to provide a variable resistance nonvolatile memory element writing method capable of suppressing variation to the low resistance-side in the high resistance state and ensuring a maximum resistance-change window.

In order to achieve the aforementioned object, a variable resistance nonvolatile memory element writing method according to an aspect of the present disclosure is a variable resistance nonvolatile memory element writing method for writing data to a variable resistance nonvolatile memory element including a first electrode, a second electrode, and a variable resistance layer which is disposed between the first electrode and the second electrode, is in contact with the first electrode and the second electrode, and reversibly changes between two resistance states consisting of a high resistance state and a low resistance state, according to an electrical signal applied between the first electrode and the second electrode, the variable resistance layer having a stacked structure including: a first metal oxide layer which is in contact with the first electrode and comprises a first metal; and a second metal oxide layer which is in contact with the second electrode and comprises a second metal, and the method comprising: (a) changing the variable resistance layer to the low resistance state indicated by a resistance value RL, by applying a negative first voltage to the second electrode, the negative first voltage being negative with respect to the first electrode; and (b) changing the variable resistance layer to the high resistance state, wherein step (b) includes: (i) changing a resistance value of the variable resistance layer to a resistance value RH which is larger than the resistance value RL, by applying a positive second voltage to the second electrode, the positive second voltage being positive with respect to the first electrode; and (ii) changing the variable resistance layer to the high resistance state indicated by a resistance value RH1 which is larger than the resistance value RH, by applying a negative third voltage to the second electrode, after the positive second voltage is applied in step (i), the negative third voltage being negative with respect to the first electrode and being smaller than an absolute value of a threshold voltage for changing the variable resistance layer from the high resistance state to the low resistance state.

Accordingly, through a high resistance writing step, writing is performed in which a negative voltage is applied after a positive voltage is applied for changing the variable resistance nonvolatile memory device to the high resistance state. Specifically, in the high resistance writing step, a second high resistance writing step for stabilizing the high resistance state is performed after a first high resistance writing step for changing to the high resistance. Stated differently, even when the variable resistance nonvolatile memory device changes to the sub-high resistance state in the first high resistance writing step, the variable resistance nonvolatile memory device can reliably change to the high resistance state through the subsequent second high resistance writing step for stabilizing the high resistance state.

Accordingly, even in a variable resistance element in which the sub-high resistance state can occur, correction to a normal high resistance state makes it possible to realize a variable resistance element writing step capable of suppressing variation to the low resistance-side in the high resistance state and ensuring a maximum resistance-change window.

Furthermore, for example, a degree of oxygen-deficiency of the first metal oxide layer may be higher than a degree of oxygen-deficiency of the second metal oxide layer.

Furthermore, for example, a resistance value of the second metal oxide layer may be larger than a resistance value of the first metal oxide layer.

Furthermore, for example, each of the first metal and the second metal may be a transition metal.

Furthermore, for example, the first metal and the second metal may be a same metal.

Here, for example, the first metal and the second metal may comprise tantalum.

Furthermore, for example, the first metal and the second metal may be different metals, and a standard electrode potential of the second metal may be lower than a standard electrode potential of the first metal.

Furthermore, for example, in step (ii), the negative third voltage may be applied after the positive second voltage is applied in step (i), and data may be read from the variable resistance nonvolatile memory element using the negative third voltage applied.

In order to achieve the aforementioned object, a variable resistance nonvolatile memory element according to an aspect of the present invention comprises: a first electrode; a second electrode; and a variable resistance layer which is disposed between the first electrode and the second electrode, is in contact with the first electrode and the second electrode, and reversibly changes between two resistance states consisting of a high resistance state and a low resistance state, according to an electrical signal applied between the first electrode and the second electrode, wherein the variable resistance layer: has a layered structure including: a first metal oxide layer which is in contact with the first electrode and comprises a first metal; and a second metal oxide layer which is in contact with the second electrode and comprises a second metal; and has characteristics of: changing to the low resistance state indicated by a resistance value RL, according to application of a negative first voltage to the second electrode, the negative first voltage being negative with respect to the first electrode; and changing to the high resistance state indicated by a resistance value RH1 which is larger than the resistance value RH, according to application of a negative third voltage to the second electrode, after a positive second voltage that is positive with respect to the first electrode is applied to the second electrode to change a resistance value of the variable resistance layer to a resistance value RH which is larger than the resistance value RL, the negative third voltage being negative with respect to the first electrode and being smaller than an absolute value of a threshold voltage for changing the variable resistance layer from the high resistance state to the low resistance state.

According to the present disclosure, it is possible to realize a variable resistance element writing method capable of suppressing variation to the low resistance-side in the high resistance state and ensuring a maximum resistance change window.

Specifically, even though there are cases where the variable resistance element changes to the sub-high resistance state which is insufficiently changed to high resistance when only the first high resistance writing is performed on the variable resistance element, the variable resistance element can reliably change to the high resistance state by performing the second high resistance writing for high resistance stabilization, after the first high resistance writing.

This makes it possible to realize a variable resistance nonvolatile memory element writing method capable of suppressing variation of the high resistance state and ensuring a maximum resistance change window in the high resistance-side. Furthermore, aside from being able to realize the stabilization of the high resistance state of the variable resistance nonvolatile memory element, high-speed memory cell reading, improved yield, and reduced power consumption can also be realized.

These general and specific aspects may be implemented using a system, a method, and an integrated circuit, or any combination of systems, methods, or integrated circuits.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the present invention. Furthermore, among the structural elements in the following exemplary embodiments, structural elements not recited in any one of the independent claims are described as arbitrary structural elements.

Hereinafter, exemplary embodiments of the present invention shall be described in detail with reference to the Drawings.

As described above, the inventors have been studying a variable resistance nonvolatile memory device including memory cells which use an oxygen-deficient oxide of a transition metal such as tantalum or hafnium, as a bipolar variable resistance material, in a variable resistance layer. Variable resistance nonvolatile memory elements including memory cells using such a material shall be described in the following embodiments.

Embodiment 1

Figure 1:
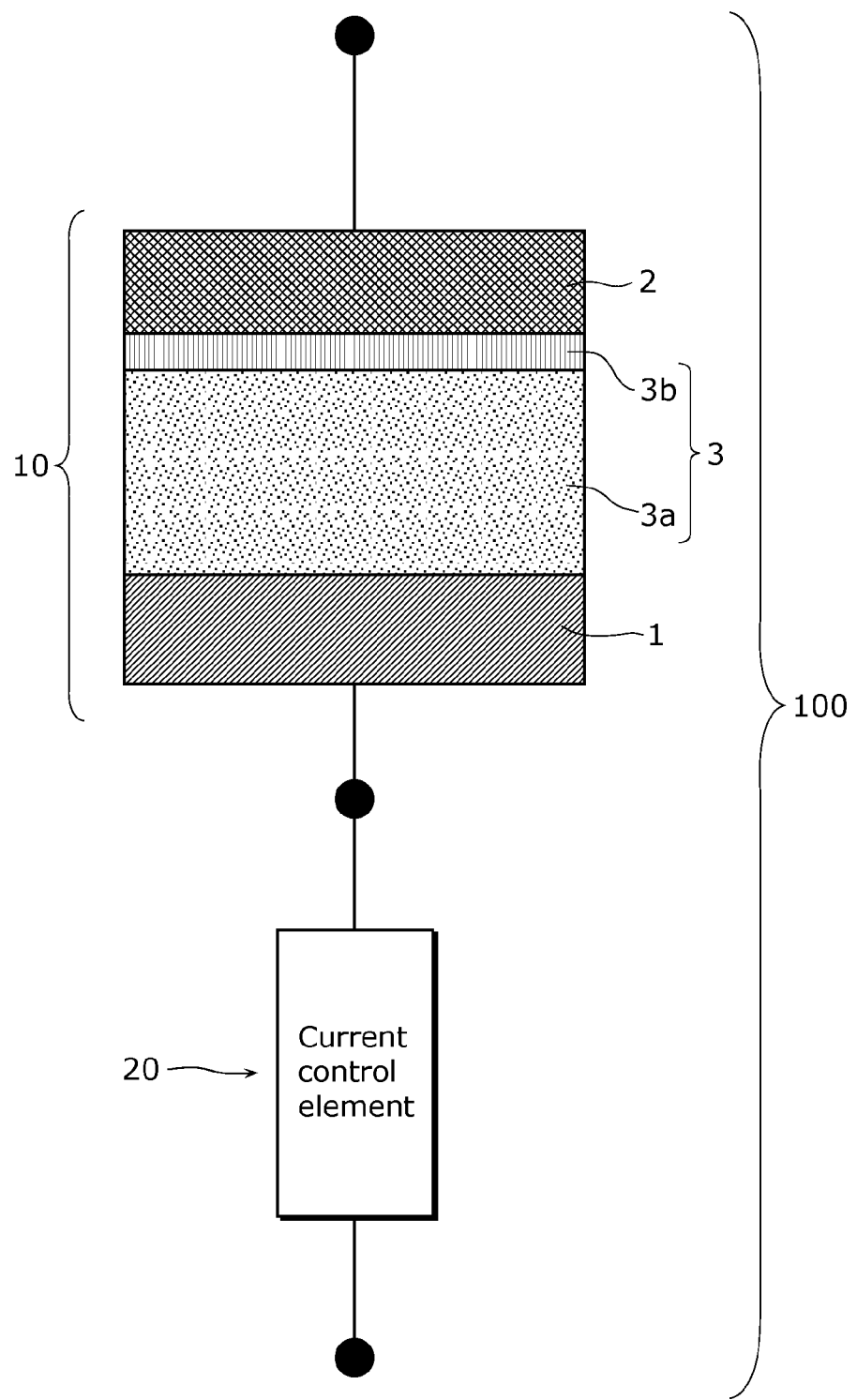
FIG. 1 is a schematic diagram showing an example of a configuration of a nonvolatile memory element according to Embodiment 1.

FIG. 1 is a schematic diagram showing an example of a configuration of a nonvolatile memory element according to Embodiment 1.

A nonvolatile memory element 100 shown in FIG. 1 includes a variable resistance element 10 and a current control element 20. The variable resistance element 10 and the current control element 20 are connected in series.

The variable resistance element 10 includes a first electrode 1, a second electrode 2, and a variable resistance layer 3 which is interposed between the first electrode 1 and the second electrode 2 and is in contact with the first electrode 1 and the second electrode 2. The first electrode 1, the variable resistance layer 3, and the second electrode 2 are stacked in such order above a substrate.

The variable resistance layer 3 is configured by being interposed between the first electrode 1 and the second electrode 2, and reversibly changes between the two states of the high resistance state and the low resistance state according to the application of an electrical signal between the first electrode 1 and the second electrode 2. The variable resistance layer 3 includes a first transition metal oxide layer 3a comprising an oxygen-deficient transition metal oxide, and a second transition metal oxide layer 3b comprising a transition metal oxide having a lower degree of oxygen-deficiency than the first transition metal oxide layer 3a.

Here, degree of oxygen deficiency refers to the percentage of deficient oxygen with respect to the amount of oxygen comprising an oxide of the stoichiometric composition of the respective transition metals. When the transitional metal is tantalum (Ta), the composition of a stoichiometric oxide is $Ta_2O_5$, and can be expressed as $TaO_{2.5}$. Here, the degree of oxygen deficiency of $TaO_{2.5}$ is 0%. Furthermore, for example, the degree of oxygen deficiency of an oxygen-deficient tantalum oxide having a composition of $TaO_{1.5}=(2.5-1.5)/2.5=40\%$.

Normally, most oxides of a stoichiometric composition exhibit insulator-like properties but most oxygen-deficient transition metal oxides exhibit semiconductor-like properties. Specifically, a transition metal oxide having a lower degree of oxygen deficiency (closer to the stoichiometric composition) is commonly considered to have a higher resistance than a transition metal oxide having a higher degree of oxygen deficiency. Here, the second transition metal oxide layer $3b$ may have a higher resistance than the first transition metal oxide layer $3a$. By adopting such a configuration, the second transition metal oxide layer $3b$ causes a majority of the voltage applied between the first electrode 1 and the second electrode 2 when changing resistance to be distributed, and thus making it easier to cause the redox reaction of the transition metal oxide occurring in the second transition metal oxide layer $3b$. For example, when the transition metal making up the second transition metal oxide layer $3b$ can have multiple stoichiometric compositions for an oxide, it is acceptable to use, among the oxides of the corresponding stoichiometric compositions, the transition metal oxide having the highest resistance value or an oxygen-deficient transition metal oxide obtained when oxygen is absent from the transition metal oxide. Furthermore, when the transition metal making up the first transition metal oxide layer $3a$ can have multiple stoichiometric compositions for an oxide, it is acceptable to use, among those oxides, an oxygen-deficient transition metal oxide having a lower resistance value than the transition metal oxide making up the second transition metal oxide layer $3b$.

Here, the same material or different materials may be used for a first transition metal making up the first transition metal oxide layer $3a$ and a second transition metal making up the second transition metal oxide layer $3b$. As a transition metal, it is possible to use tantalum (Ta), titanium (Ti), hafnium (Hf), zirconium (Zr), niobium (Nb), tungsten (W), and so on. Since the transition metal can have plural oxidation states, different resistance states can be realized through redox reaction. When different materials are used for the first transition metal and the second transition metal, the standard electrode potential of the second transition metal may be lower than the standard electrode potential of the first transition metal. It is possible that the phenomena of changing resistance occurs when a redox reaction occurs inside the second transition metal oxide layer $3b$ which has a high resistance or in a minute filament (conductive path) formed near the second transition metal oxide layer $3b$, and the resistance value thereof changes. A lower value for the standard electrode potential shows characteristics suggesting easier oxidation, and stable operation can be expected when more redox reactions occur in the second transition metal oxide layer $3b$.

Here, it is possible that an increase in the resistance value (change to high resistance) of the variable resistance layer 3 is expressed by oxygen ions moving from the first transition metal oxide layer $3a$ to the second transition metal oxide layer $3b$ due to positive voltage pulses, and compensating for the oxygen defect in the second transition metal oxide layer $3b$ or the minute filament formed near the second transition metal oxide layer $3b$. On the other hand, it is possible that a decrease in the resistance value (change to low resistance) of the variable resistance layer 3 is expressed by oxygen ions moving from the second transition metal oxide layer $3b$ to the first transition metal oxide layer $3a$ due to negative voltage pulses, and the oxygen defect in the second transition metal oxide layer $3b$ or the minute filament formed near the second transition metal oxide layer $3b$ increasing.

When, for example, tantalum is used for both the first transition metal making up the first transition metal oxide layer $3a$ and the second transition metal making up the second transition metal oxide layer $3b$, it is acceptable that $0.8 \le x \le 1.9$, $x<y$ when the first transition metal oxide layer $3a$ is expressed as $TaO_x$ and the second transition metal oxide layer $3b$ is expressed as $TaO_y$.

Furthermore, when, for example, hafnium is used for both the first transition metal making up the first transition metal oxide layer $3a$ and the second transition metal making up the second transition metal oxide layer $3b$, it is acceptable that $0.9 \le x \le 1.6$, and y satisfies $1.8<y$, when the composition of the first transition metal oxide layer $3a$ is $HfO_x$ and the composition of the second transition metal oxide layer $3b$ is $HfO_y$. Furthermore, when, for example, zirconium is used for both the first transition metal making up the first transition metal oxide layer $3a$ and the second transition metal making up the second transition metal oxide layer $3b$, it is acceptable that $0.9 \le x \le 1.4$, and y satisfies $1.9<y$, when the composition of the first transition metal oxide layer $3a$ is $ZrO_x$ and the composition of the second transition metal oxide layer $3b$ is $ZrO_y$.

The second electrode 2 includes a simple metal or an alloy that have a higher standard electrode potential than the transition metal making up the variable resistance layer 3. The second electrode 2 may have a single-layer structure or a stacked structure having multiple layers. Here, a metal having a higher standard electrode potential than the transition metal making up the variable resistance layer 3 may be a noble metal such as platinum (Pt), iridium (Ir), and palladium (Pd).

When the material of the variable resistance layer 3 includes an oxygen-deficient transition metal oxide, the material selected for the material making up the second electrode 2 is a material which has a standard electrode potential that is higher than the standard electrode potential of the transition metal making up the oxygen-deficient transition metal oxide, and has characteristics in which the standard electrode potential of the lower electrode layer (the first electrode 1) is lower than the standard electrode potential of the upper electrode layer (the second electrode 2). Accordingly, stable operation can be achieved because the redox reaction of the variable resistance layer 3 occurs preferentially according to the applied voltage, in the interface of the electrode having the higher standard electrode potential (the second electrode 2) and the variable resistance layer 3, and a variable resistance layer having high oxygen concentration or low oxygen concentration can be formed. In particular, when the oxygen deficient transition metal oxide is tantalum oxide, it is sufficient to use the aforementioned electrode material having a higher standard electrode potential (for example, Pt, Ir, Pd, etc.) for the electrode that comes into contact with the first transition metal oxide layer $3a$ which has a low degree of oxygen deficiency, and use the aforementioned electrode material having the lower standard electrode potential (for example, tantalum (Ta), tantalum nitride (TaN), titanium (Ti), etc.) for the electrode that comes into contact with the second transition metal oxide layer $3b$ which has a high degree of oxygen deficiency.

By adopting such a configuration, the variable resistance element 10 can have stable resistance-changing characteristics.

Furthermore, the current control element 20 is configured of a load resistance element such as a selection transistor or a diode.

The current control element 20 has a threshold voltage in each of a positive applied voltage region and a negative applied voltage region, and has non-linear characteristics such as changing to a conducting (ON) state when the absolute value of the applied voltage is larger than the absolute value of the respective threshold voltages, and changing to a cut-off (OFF) state when the value of the applied voltage is in another region (when the absolute value of the applied voltage is smaller than the absolute value of the respective thresholds). Specifically, when the current control element 20 is in a conducting state (ON), the current control element functions as a load resistance with respect to the variable resistance element 10.

Thus, the nonvolatile memory element 100 is structured as described above.

Next, the high resistance writing method for the nonvolatile memory element 100 structured in the above-described manner shall be described next.

Figure 2A:
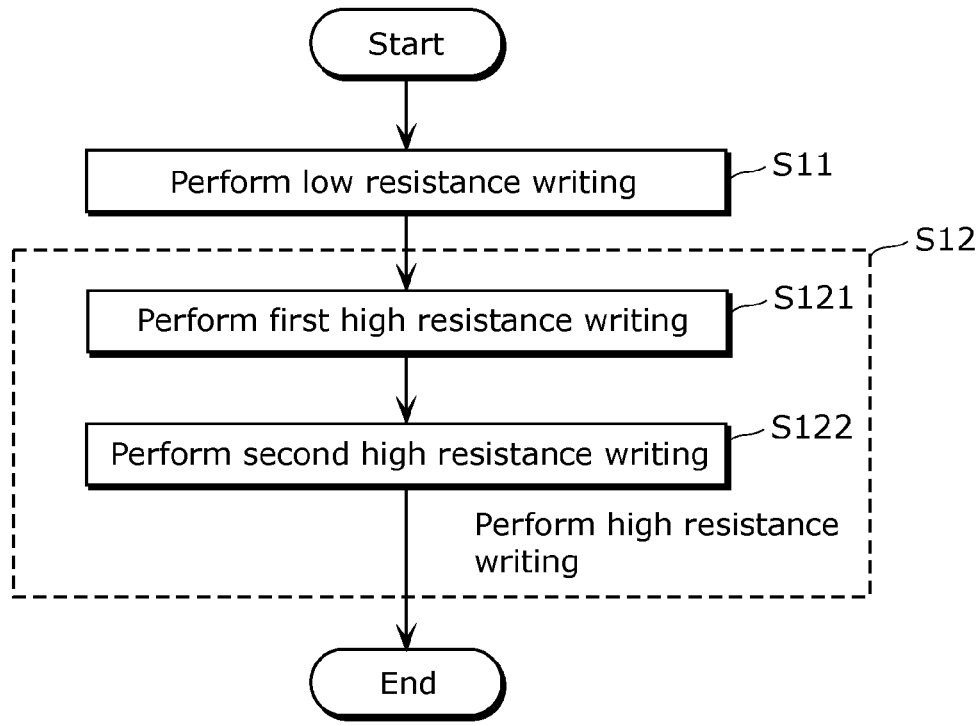
FIG. 2A is a flowchart for describing the nonvolatile memory element high resistance writing method according to Embodiment 1.
Figure 2B:
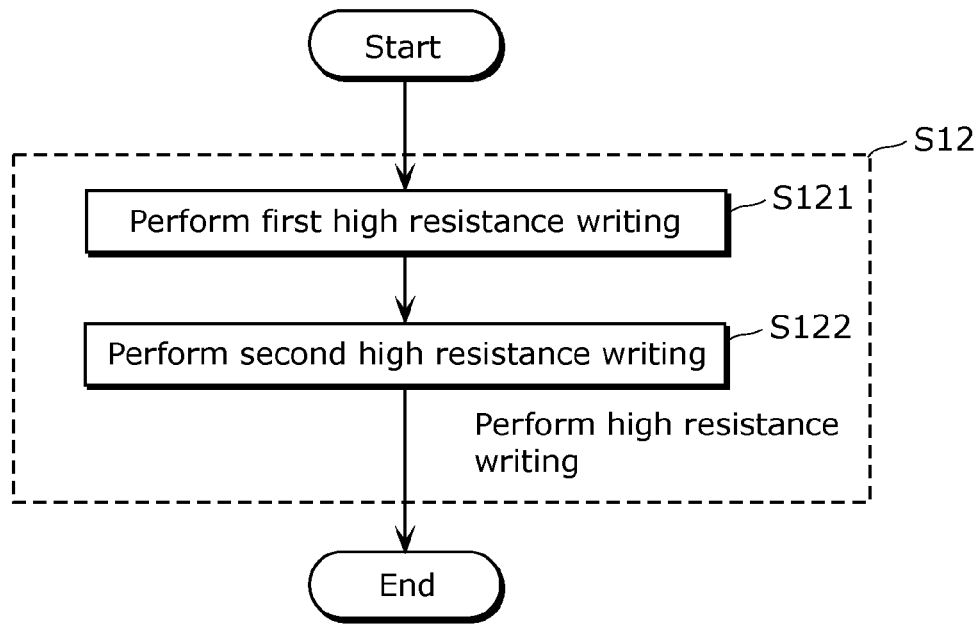
FIG. 2B is a flowchart for describing the nonvolatile memory element writing method according to Embodiment 1.
Figure 3A:
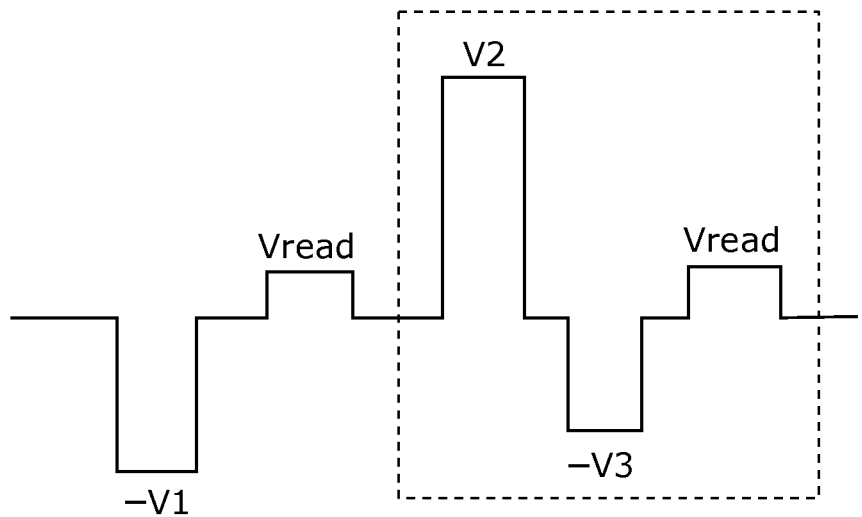
FIG. 3A is a diagram for describing the nonvolatile memory element high resistance writing method according to Embodiment 1.
Figure 3B:
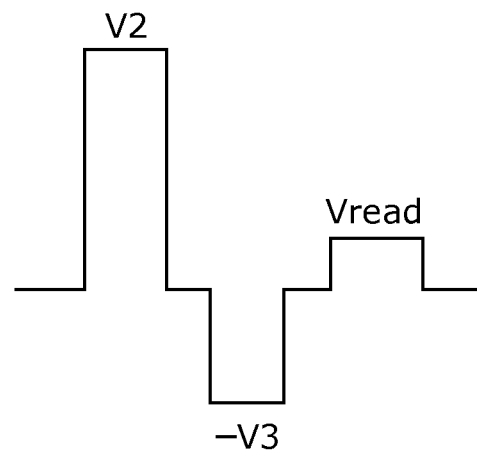
FIG. 3B is a diagram for describing the nonvolatile memory element high resistance writing method according to Embodiment 1.

FIG. 2A is a flowchart for describing the writing method nonvolatile memory element high resistance writing method according to Embodiment 1. FIG. 2B is a flowchart showing the steps surrounded by the broken line in FIG. 2A. FIG. 3A is a diagram for describing the nonvolatile memory element high resistance writing method according to Embodiment 1. FIG. 3B is a diagram showing the portion surrounded by the broken line in FIG. 3A. FIG. 3A is a diagram for describing the conventional nonvolatile memory element high resistance writing method. It should be noted that the nonvolatile memory element writing method according to Embodiment 1 need only include at least the steps shown in FIG. 2B and FIG. 3B, and that the other steps are arbitrary steps utilized as necessary according to the embodiment.

It should be noted that, unless stated otherwise, with regard to the polarity of the applied voltage, the case where a higher voltage is applied to the second electrode 2 than to the first electrode 1 of the variable resistance element 10 is defined as positive voltage application in the following description.

As shown in FIG. 2A, first, low resistance writing to change the variable resistance layer 3 to the low resistance state is performed by applying, to the second electrode 2, a first voltage −V1 which is negative with respect to the first electrode 1 and has a sufficiently larger amplitude than a low resistance threshold voltage, in the variable resistance element 10 (S11). Here, the voltage at which the change to low resistance starts to occur in the case where a negative voltage is applied to the variable resistance element 10 that is in a first high resistance state and the amplitude of the voltage is gradually increased, is called the low resistance threshold voltage. In the same manner, the voltage at which the change to high resistance starts to occur in the case where a positive voltage is applied to the variable resistance element 10 that is in the low resistance state and the amplitude of the voltage is gradually increased, is called a first high resistance threshold voltage.

Specifically, as shown in FIG. 3A, a first voltage (low resistance writing voltage) −V1 is applied to the variable resistance element 10 to change the variable resistance layer 3 to the low resistance state. Although not shown in FIG. 2A, in this state, the low resistance threshold voltage or a voltage having a lower amplitude than the first high resistance threshold voltage may be applied to read the resistance value of the variable resistance element 10, as shown in 3A ("Vread" in FIG. 3A).

Next, high resistance writing to change the variable resistance layer 3 to the high resistance state is performed in the variable resistance element 10 (S12).

More specifically, in S12, first a first high resistance writing to change the variable resistance element 10 to the first high resistance state is performed by applying, to the second electrode 2, a second voltage V2 which is positive with respect to the first electrode 1 and has a sufficiently larger amplitude than the first high resistance threshold voltage (S121). Next, after the second voltage V2 is applied in S121, a second high resistance writing to change the variable resistance layer 3 to a second high resistance state is performed by applying, to the second electrode 2, a third voltage −V3 which is negative with respect to the first electrode 1 and has a smaller amplitude than the low resistance threshold voltage (S122).

Specifically, as shown in FIG. 3A, after the variable resistance layer 3 is changed to the first high resistance state by applying the first high resistance writing voltage V2 to the variable resistance element 10, a second high resistance writing voltage −V3 is applied to the nonvolatile memory element 100 to change the variable resistance layer 3 to the second high resistance state. Here, as shown in FIG. 3A, the first high resistance writing voltage V2 and the second high resistance writing voltage −V3 have different polarities and the amplitude of the second high resistance writing voltage −V3 is smaller than the absolute value of the low resistance threshold voltage. Here, the resistance value of the second high resistance state is higher than the resistance value of the first high resistance state.

Thus, the high resistance writing of the nonvolatile memory element 100 is performed as described above.

Specifically, although there are cases where the variable resistance element 10 is changed to an insufficiently high resistance state when only the first high resistance writing is performed on the variable resistance element 10, the variable resistance element 10 can be reliably changed to the high resistance state by performing the second high resistance writing after the first high resistance writing. This makes it possible to realize a variable resistance nonvolatile memory element writing method capable of suppressing variation of the high resistance state and ensuring a maximum resistance-change window (difference between respective resistance values of the low resistance state and the high resistance state) in the high resistance-side.

Furthermore, aside from being able to realize the stabilization of the high resistance state of the variable resistance nonvolatile memory element 100, the widening of the window for resistance change also produces the advantageous effect of being able to realize high-speed memory cell reading, improved yield, and reduced power consumption.

It should be noted that the nonvolatile memory element writing method according to Embodiment 1 need only include the nonvolatile memory element high resistance writing step (S12) shown in FIG. 2B and FIG. 3B, and that S11 is an arbitrary step that is introduced as necessary. Furthermore, the nonvolatile memory element high resistance writing (S12) is not limited to one execution, and may be performed multiple times. Even in such a case, by ending the flow of the high resistance writing (S12) with the second high resistance writing (S122), that is, by adopting the second high resistance writing voltage as the voltage to be applied last in the writing method in this embodiment, the aforementioned advantageous effect can be realized.

The mechanism for how the writing method in this embodiment is able to suppress the variation to the low resistance-side in the high resistance state is described below.

First, the conventional nonvolatile memory element writing method shall be described, and then arriving at the nonvolatile memory element writing method in Embodiment 1 based on the conventional method shall be described.

Figure 4:
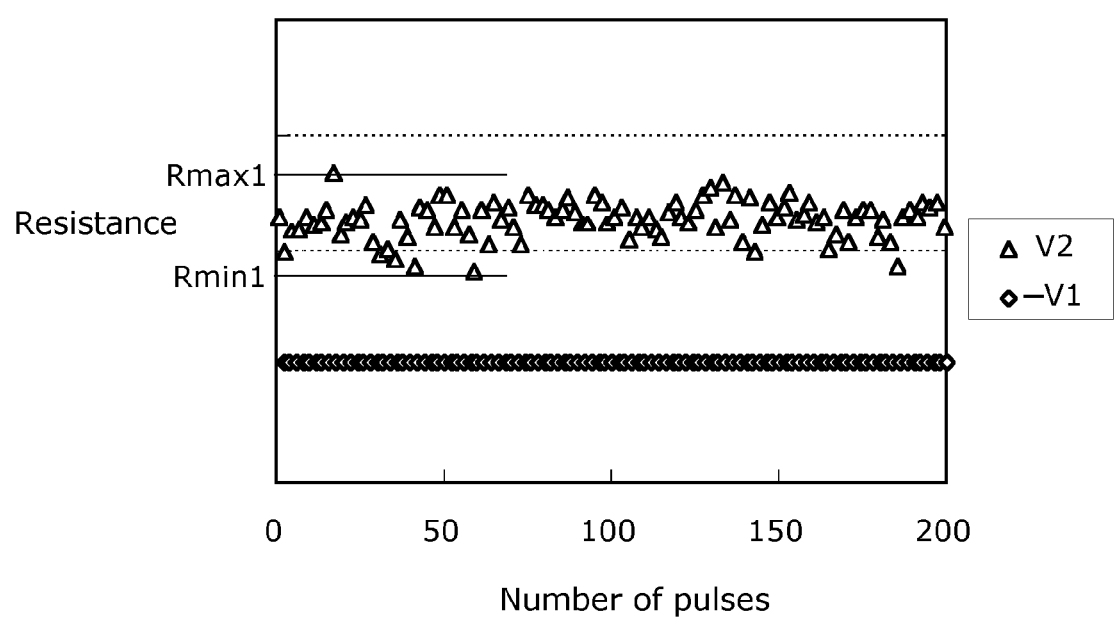
FIG. 4 is a graph showing the resistance change when alternating positive and negative pulses are applied to the nonvolatile memory element according to Embodiment 1, using the conventional writing method.
Figure 5:
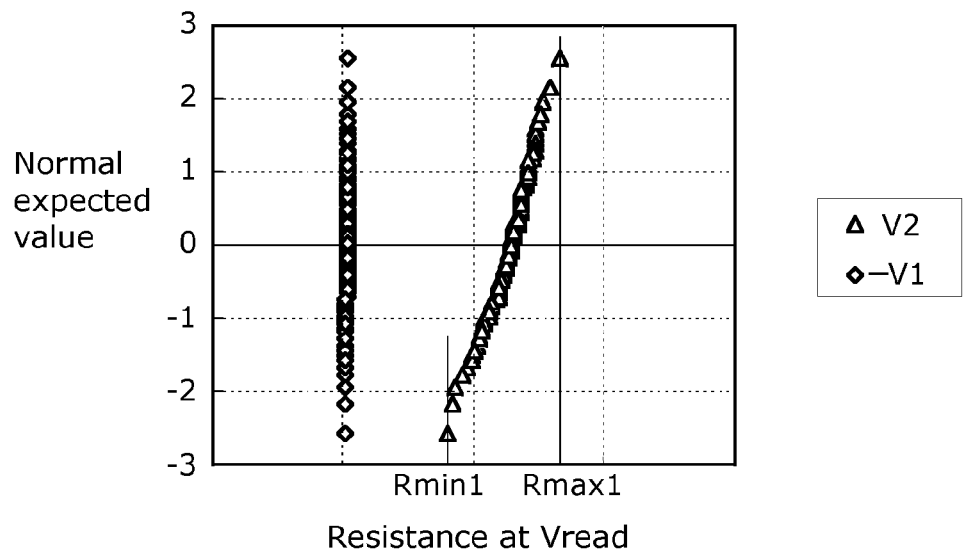
FIG. 5 is a graph showing the normalized expected value distribution of resistance values at the time of resistance change, when alternating positive and negative pulses are applied to the nonvolatile memory element according to Embodiment 1, using the conventional writing method.

FIG. 4 is a graph showing the resistance change when alternating positive and negative pulses are applied to the nonvolatile memory element according to Embodiment 1, using the conventional writing method. FIG. 5 is a graph showing the normalized expected value distribution of resistance values at the time of resistance change, when alternating positive and negative pulses are applied to the nonvolatile memory element according to Embodiment 1, using the conventional writing method.

Figure 3C:
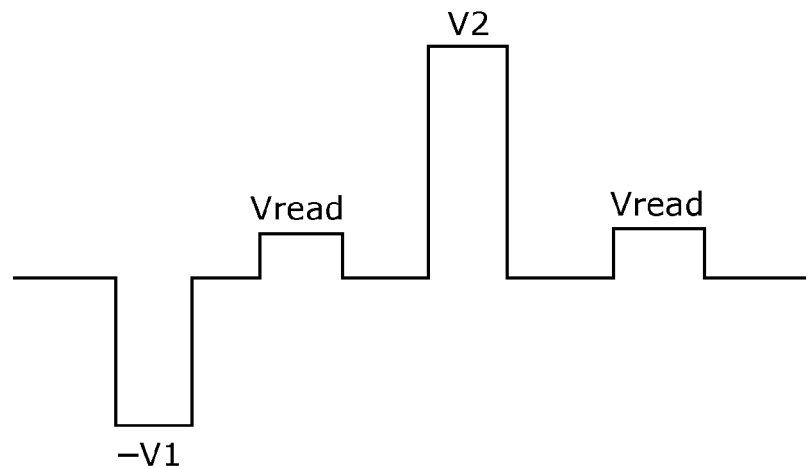
FIG. 3C is a diagram for describing the conventional nonvolatile memory element high resistance writing method.

In FIG. 4, the two resistance states of the high resistance state and the low resistance state are reversibly changed by applying electrical signals of different polarities between the first electrode 1 and the second electrode 2 of the nonvolatile memory element 100 shown in FIG. 1. Specifically, FIG. 4 illustrates the resistance change when the high resistance writing voltage V2 and the low resistance writing voltage −V1 are alternately applied to the terminals at both ends (including the variable resistance element 10 and the current control element 20) of the nonvolatile memory element 100 as shown in FIG. 3C. The horizontal axis in FIG. 4 denotes the number of applications of the high resistance writing voltage or the low resistance writing voltage, that is, the respective voltage pulse applications (number of pulses), and the vertical axis denotes the resistance value of the nonvolatile memory element 100. FIG. 5 illustrates the normalized expected value distribution of resistance values at the respective times.

Here, a fixed resistance having a resistance value R is used as an element representing the function of the current control element 20. Furthermore, the pulse width of the voltage applied to the nonvolatile memory element 100 is 200 ns. The resistance value of the nonvolatile memory element 100 is the value obtained when measurement (reading) is performed using Vread, after the application of the high resistance writing voltage or the low resistance writing voltage, that is, after application of the respective voltage pulses.

It can be seen in through FIG. 4 and FIG. 5 that the resistance values of the nonvolatile memory element 100 in the high resistance state are the minimum value Rmin1 and the maximum value Rmax1, and that there is a variance of approximately one digit.

Next, the changing of resistance of the nonvolatile memory element 100, from the low resistance state to the high resistance state, according to the conventional nonvolatile memory element writing method is studied in detail, and the results shall be described.

Figure 6:
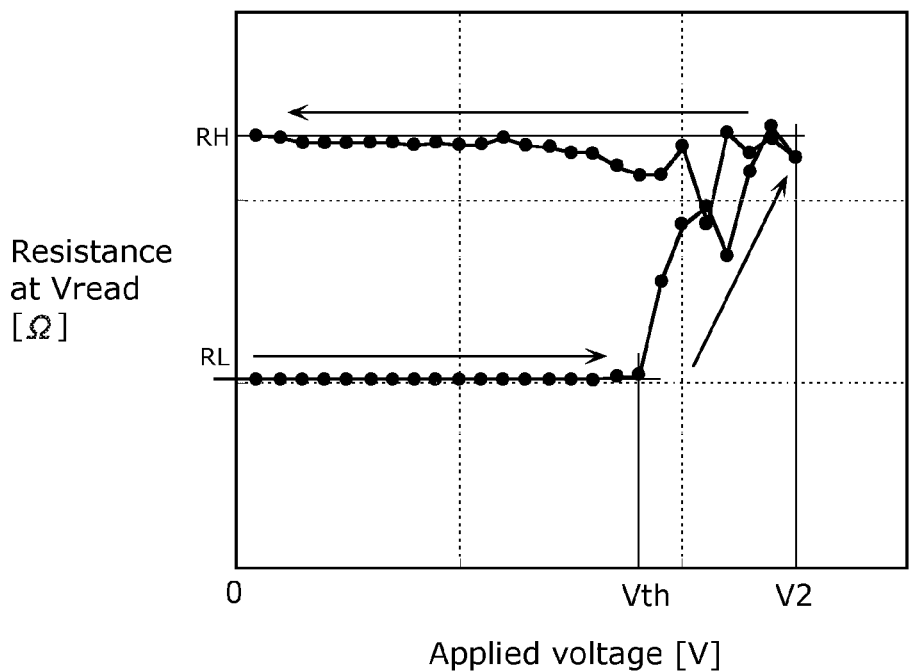
FIG. 6 is a graph showing the resistance-change characteristics when the nonvolatile memory element according to Embodiment 1 is caused to change from a low resistance state to a high resistance state by voltage sweeping.

FIG. 6 is a graph showing the resistance-change characteristics when the nonvolatile memory element according to Embodiment 1 is caused to change from a low resistance state RL to a high resistance state RH by voltage sweeping.

FIG. 6 illustrates the resistance value of the nonvolatile memory element 100 when, in the case where the nonvolatile memory element 100 is in the low resistance state RL, a positive voltage pulse is applied (voltage sweeping) to the nonvolatile memory element 100 while the amplitude of the positive voltage pulse is increased up to the high resistance writing voltage V2 using a predetermined step voltage.

Here, the pulse width of the positive pulse is 200 ns, and the resistance value is obtained by applying Vread to the nonvolatile memory element 100 after application of the respective pulses, and detecting the current flowing in the nonvolatile memory element 100.

FIG. 6 shows that, up to when the applied voltage of the positive voltage pulse is Vth, the resistance value of the nonvolatile memory element 100 virtually does not change and remains in the low resistance state RL. When the applied voltage becomes larger than Vth, the resistance value begins to increase. Specifically, here, when such voltage at which the change to high resistance starts is considered to be the first high resistance threshold voltage, the first high resistance threshold voltage is Vth. There is observed a phenomenon where, although the resistance value temporarily decreases along the way as the applied voltage is increased, the resistance, while repeatedly rising and falling, gradually increases and reaches the high resistance state RH.

It is possible that the variation of the resistance value of the high resistance state RH is large, as shown in FIG. 4 and FIG. 5, because increases and decreases of the resistance value occur at the same time during the change to the high resistance as shown in FIG. 6.

Here, as described earlier, it is possible that the increase in the resistance value of the variable resistance layer 3 is expressed by oxygen ions moving from the first transition metal oxide layer 3a to the second transition metal oxide layer 3b due to positive voltage pulses, and compensating for the oxygen defect in the second transition metal oxide layer 3b or the minute filament formed near the second transition metal oxide layer 3b. On the other hand, it is possible that the decrease in the resistance value during the change to high resistance manifests itself due to an increase in the oxygen defect due to the advancement of insulation breakdown in the minute filament of the second transition metal oxide layer 3b or the minute filament formed near the second transition metal oxide layer 3b due to positive voltage pulses, and the release of electrons trapped in the oxygen defect.

Next, the changing of resistance of the nonvolatile memory element 100, from the high resistance state to the low resistance state, according to the conventional nonvolatile memory element writing method is studied in detail, and the results shall be described. The writing to the first high resistance state using positive voltage pulses shall be called the first high resistance writing step.

Figure 7:
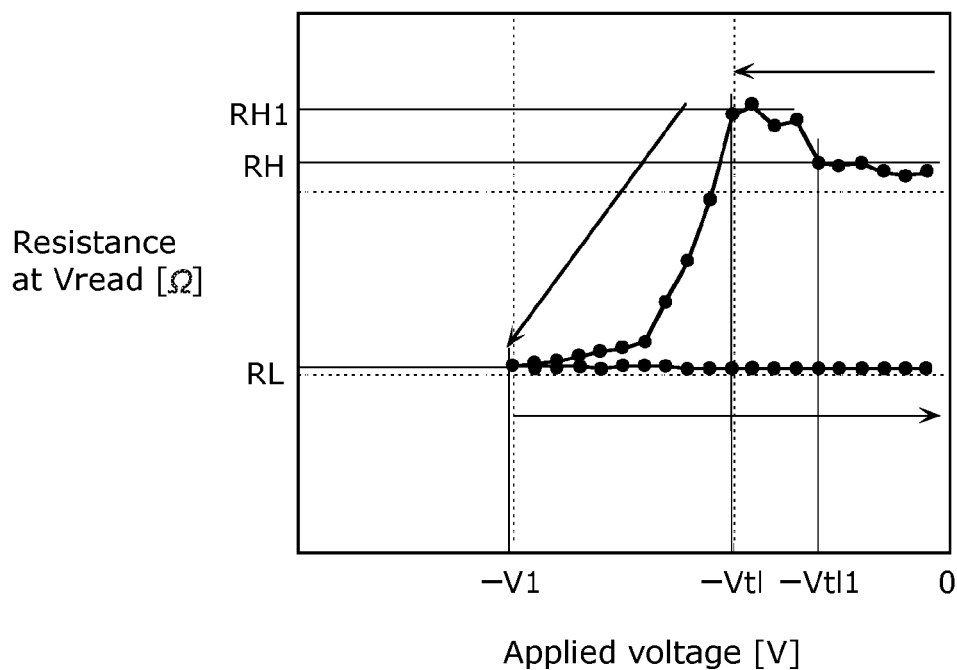
FIG. 7 is a graph showing the resistance-change characteristics when the nonvolatile memory element according to Embodiment 1 is caused to change from a high resistance state to a low resistance state by voltage sweeping.
Figure 8A:
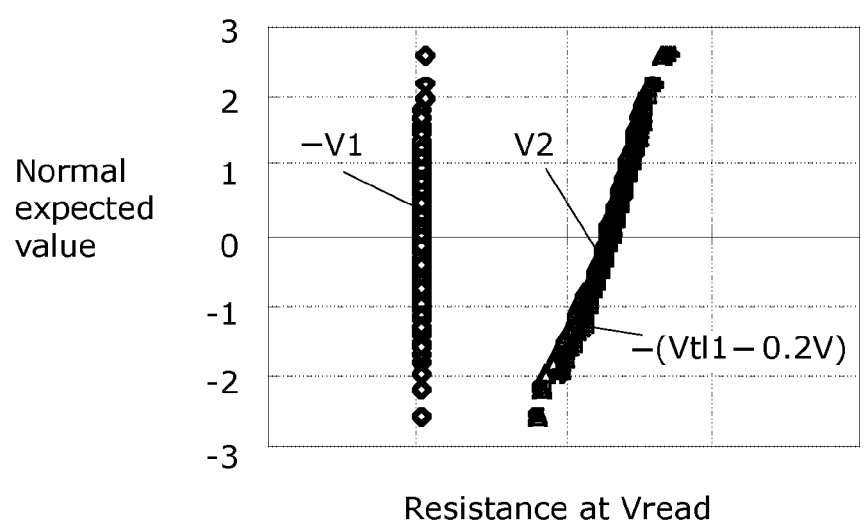
FIG. 8A is a graph illustrating the normalized expected value distribution of resistance values when the high resistance writing method according to Embodiment 1 is executed 100 times and the width of the high resistance stabilization writing voltage pulse is 200 ns.
Figure 8B:
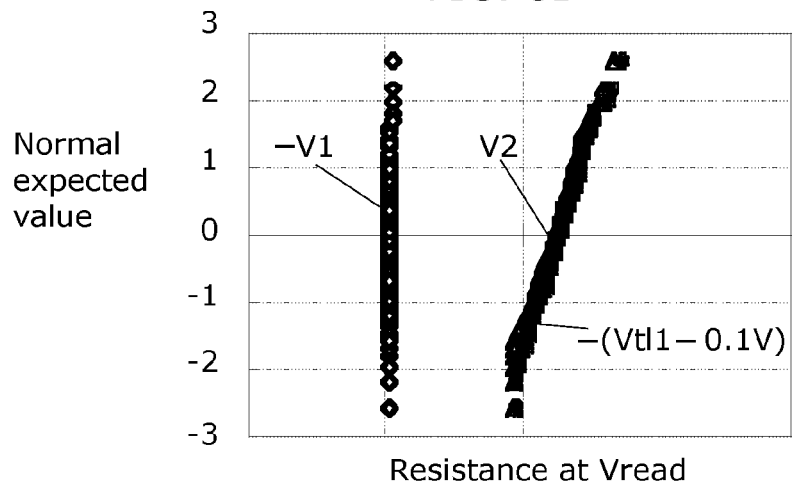
FIG. 8B is a graph illustrating the normalized expected value distribution of resistance values when the high resistance writing method according to Embodiment 1 is executed 100 times and the width of the high resistance stabilization writing voltage pulse is 200 ns.
Figure 8C:
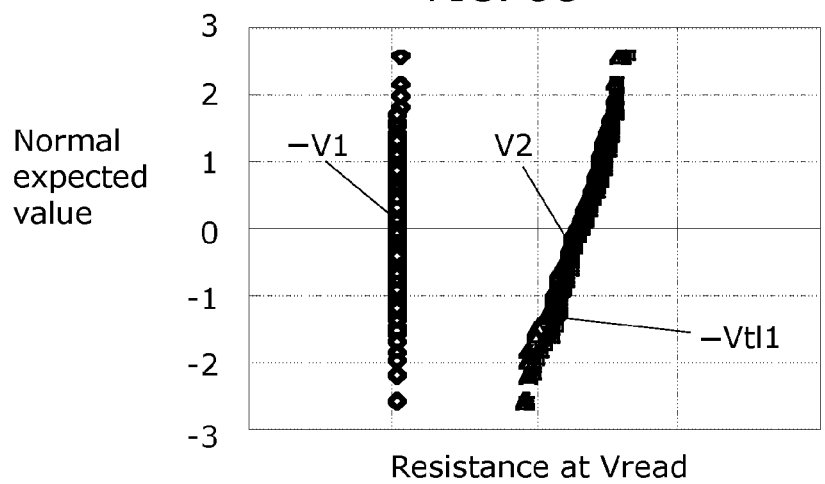
FIG. 8C is a graph illustrating the normal expected value distribution of resistance values when the high resistance writing method according to Embodiment 1 is executed 100 times and the width of the high resistance stabilization writing voltage pulse is 200 ns.
Figure 8D:
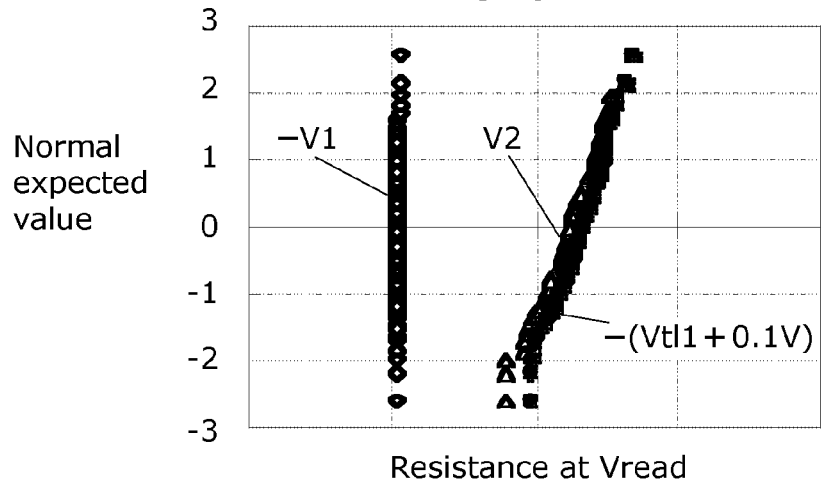
FIG. 8D is a graph illustrating the normal expected value distribution of resistance values when the high resistance writing method according to Embodiment 1 is executed 100 times and the width of the high resistance stabilization writing voltage pulse is 200 ns.
Figure 8E:
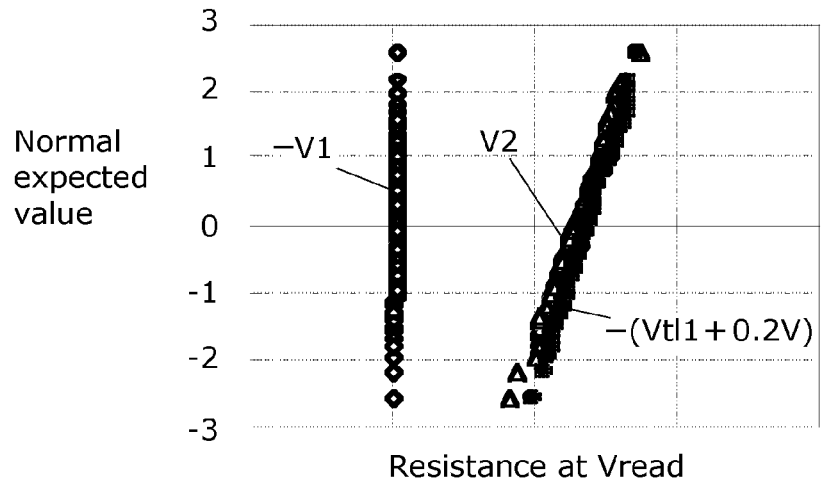
FIG. 8E is a graph illustrating the normal expected value distribution of resistance values when the high resistance writing method according to Embodiment 1 is executed 100 times and the width of the high resistance stabilization writing voltage pulse is 200 ns.
Figure 8F:
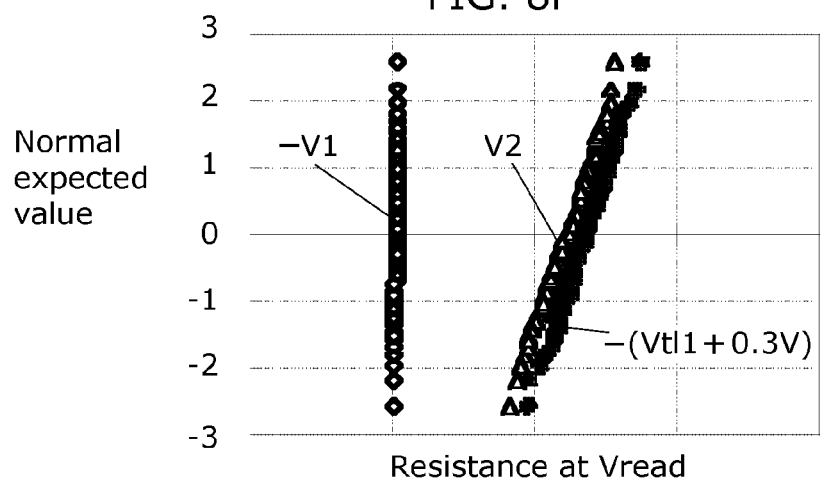
FIG. 8F is a graph illustrating the normal expected value distribution of resistance values when the high resistance writing method according to Embodiment 1 is executed 100 times and the width of the high resistance stabilization writing voltage pulse is 200 ns.
Figure 8G:
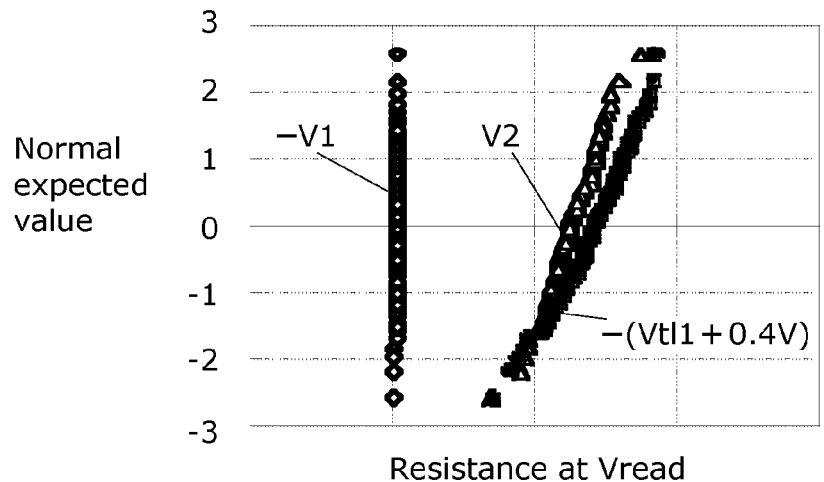
FIG. 8G is a graph illustrating the normal expected value distribution of resistance values when the high resistance writing method according to Embodiment 1 is executed 100 times and the width of the high resistance stabilization writing voltage pulse is 200 ns.
Figure 9A:
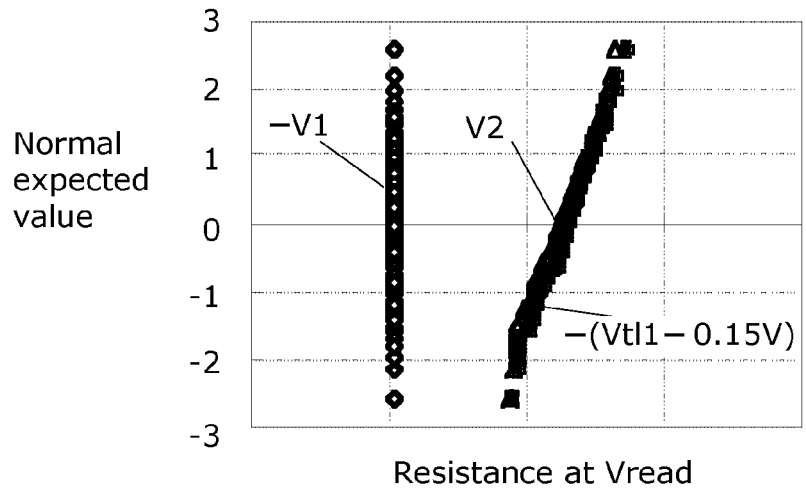
FIG. 9A is a graph illustrating the normal expected value distribution of resistance values when the high resistance writing method according to Embodiment 1 is executed 100 times and the width of the high resistance stabilization writing voltage pulse is 1 µs.
Figure 9B:
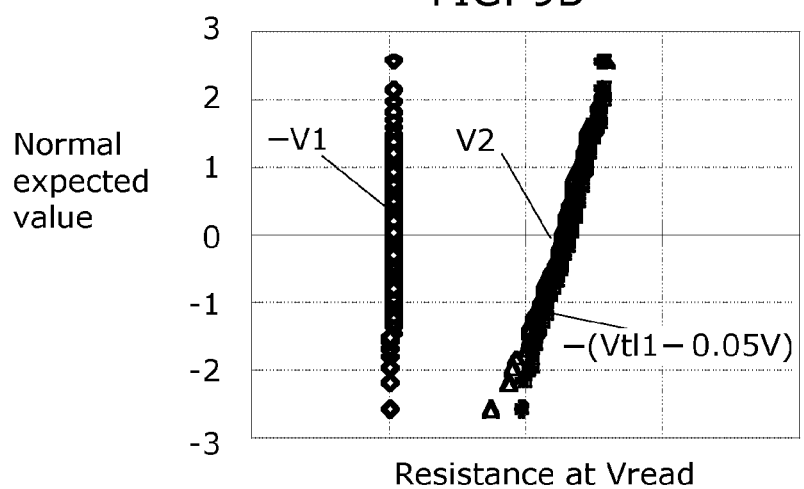
FIG. 9B is a graph illustrating the normal expected value distribution of resistance values when the high resistance writing method according to Embodiment 1 is executed 100 times and the width of the high resistance stabilization writing voltage pulse is 1 µs.
Figure 9C:
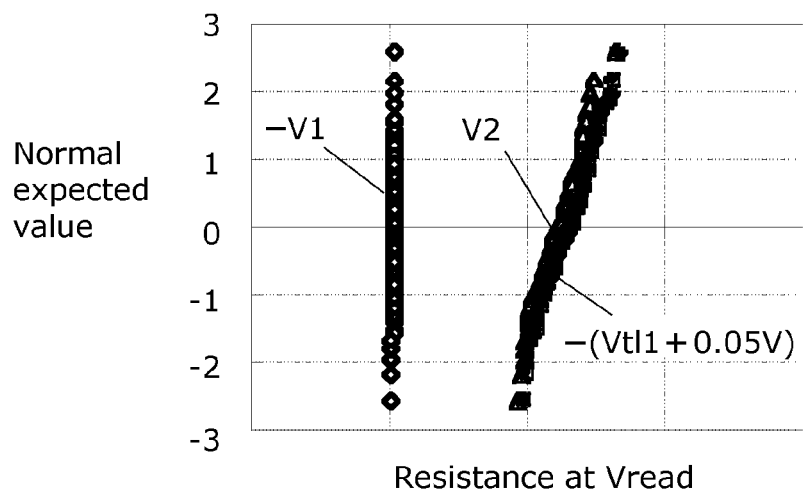
FIG. 9C is a graph illustrating the normal expected value distribution of resistance values when the high resistance writing method according to Embodiment 1 is executed 100 times and the width of the high resistance stabilization writing voltage pulse is 1 µs.
Figure 9D:
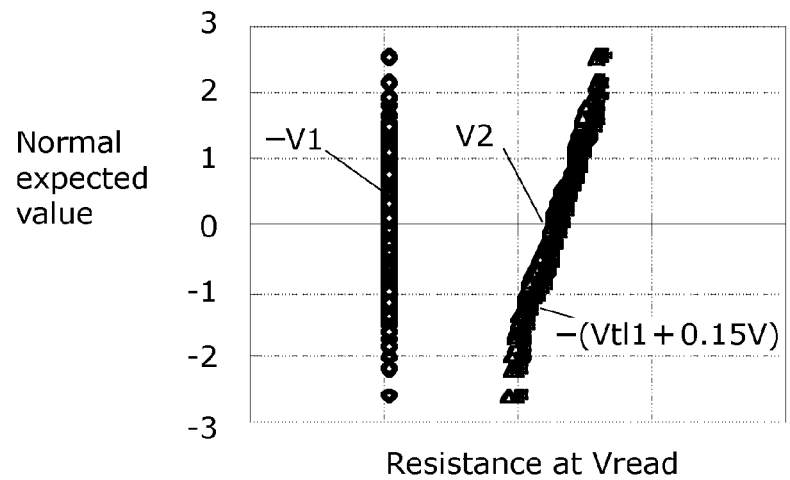
FIG. 9D is a graph illustrating the normal expected value distribution of resistance values when the high resistance writing method according to Embodiment 1 is executed 100 times and the width of the high resistance stabilization writing voltage pulse is 1 µs.
Figure 9E:
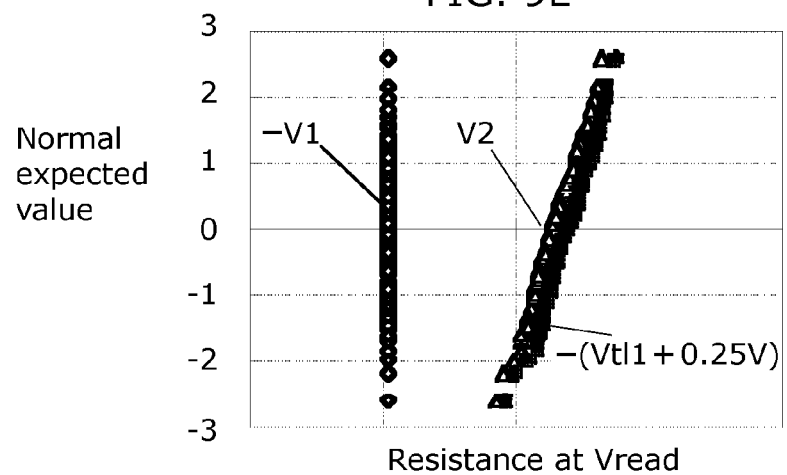
FIG. 9E is a graph illustrating the normal expected value distribution of resistance values when the high resistance writing method according to Embodiment 1 is executed 100 times and the width of the high resistance stabilization writing voltage pulse is 1 µs.
Figure 9F:
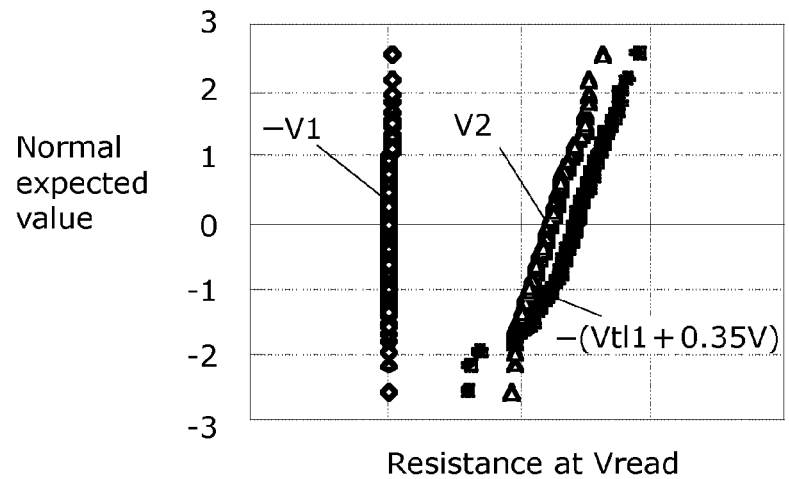
FIG. 9F is a graph illustrating the normal expected value distribution of resistance values when the high resistance writing method according to Embodiment 1 is executed 100 times and the width of the high resistance stabilization writing voltage pulse is 1 µs.
Figure 9G:
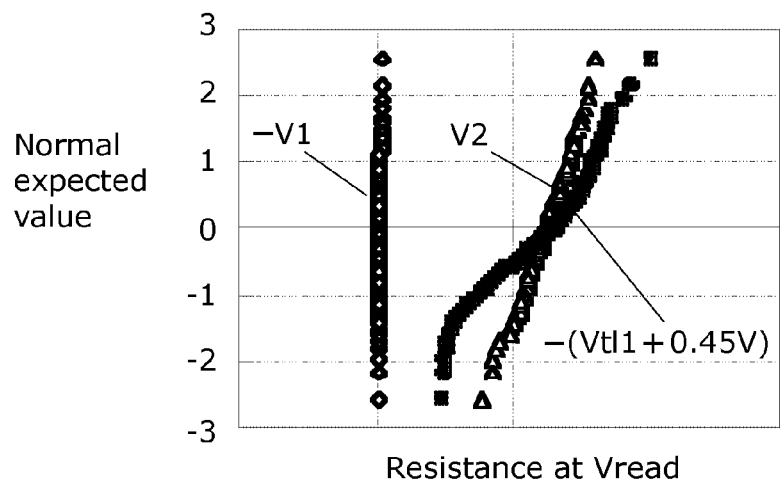
FIG. 9G is a graph illustrating the normal expected value distribution of resistance values when the high resistance writing method according to Embodiment 1 is executed 100 times and the width of the high resistance stabilization writing voltage pulse is 1 µs.
Figure 10A:
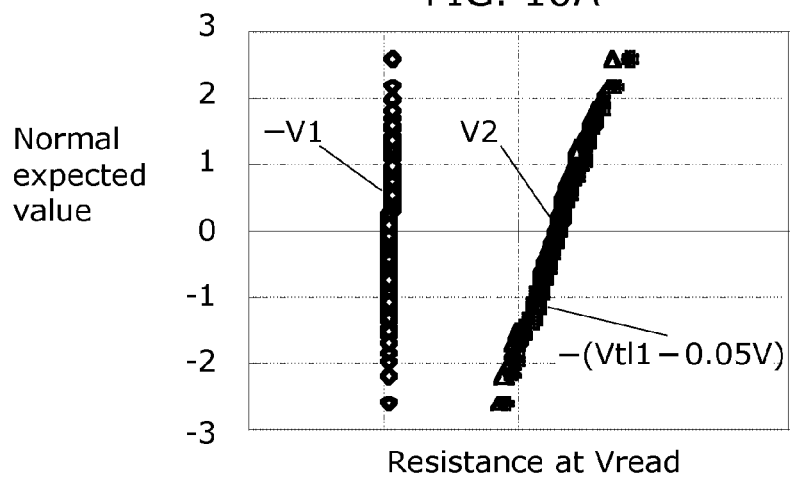
FIG. 10A is a graph illustrating the normal expected value distribution of resistance values when the high resistance writing method according to Embodiment 1 is executed 100 times and the width of the high resistance stabilization writing voltage pulse is 10 µs.
Figure 10B:
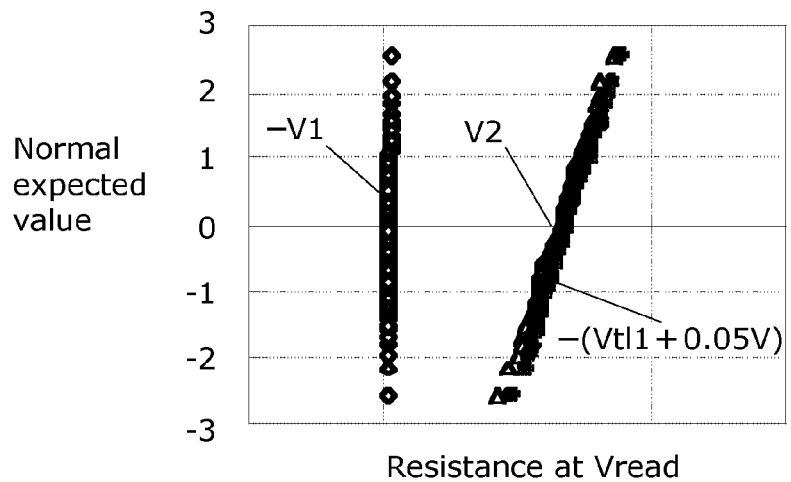
FIG. 10B is a graph illustrating the normal expected value distribution of resistance values when the high resistance writing method according to Embodiment 1 is executed 100 times and the width of the high resistance stabilization writing voltage pulse is 10 µs.
Figure 10C:
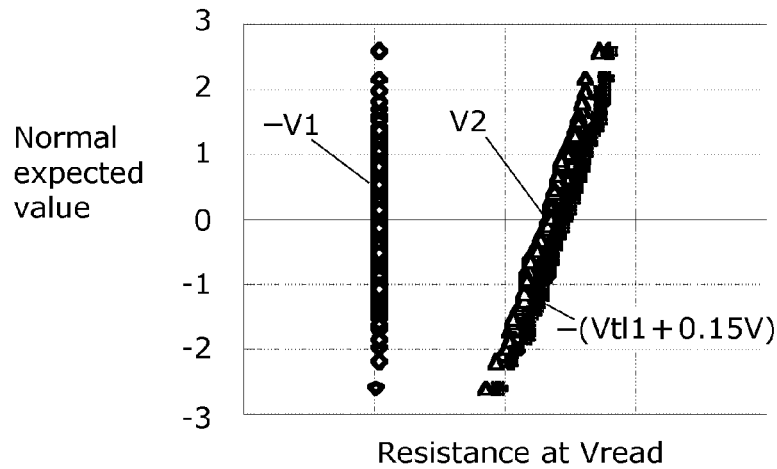
FIG. 10C is a graph illustrating the normal expected value distribution of resistance values when the high resistance writing method according to Embodiment 1 is executed 100 times and the width of the high resistance stabilization writing voltage pulse is 10 µs.
Figure 10D:
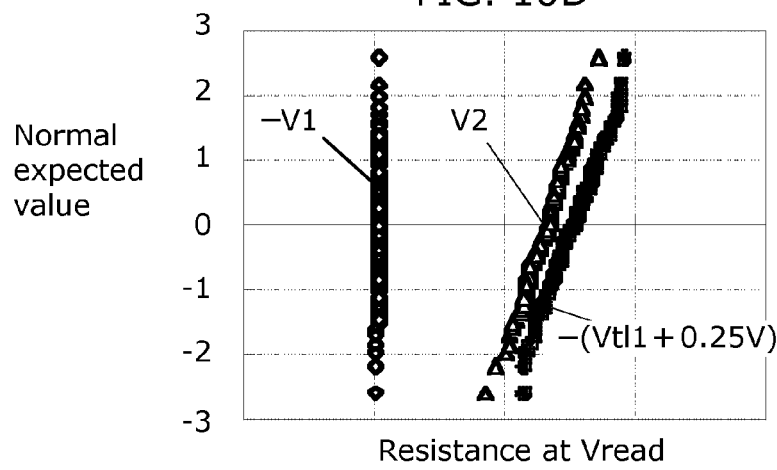
FIG. 10D is a graph illustrating the normal expected value distribution of resistance values when the high resistance writing method according to Embodiment 1 is executed 100 times and the width of the high resistance stabilization writing voltage pulse is 10 µs.
Figure 10E:
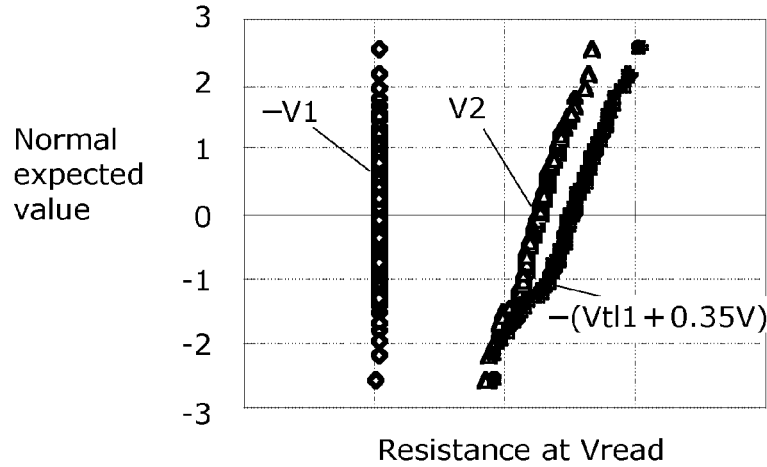
FIG. 10E is a graph illustrating the normal expected value distribution of resistance values when the high resistance writing method according to Embodiment 1 is executed 100 times and the width of the high resistance stabilization writing voltage pulse is 10 µs.
Figure 10F:
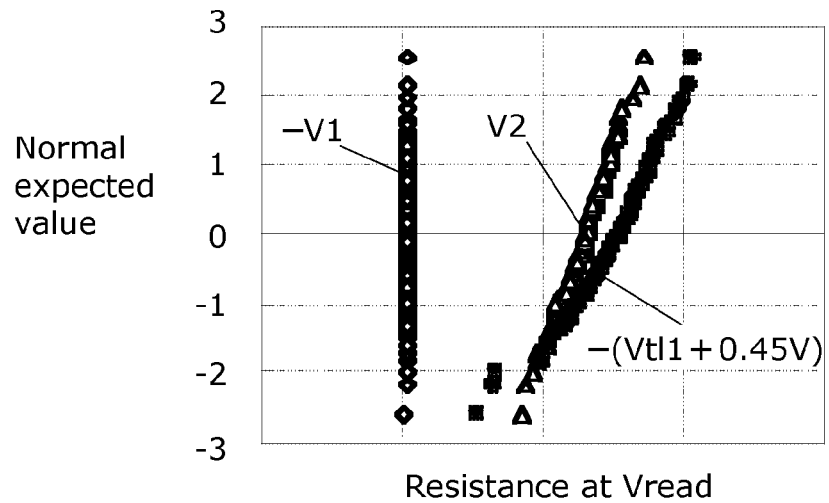
FIG. 10F is a graph illustrating the normal expected value distribution of resistance values when the high resistance writing method according to Embodiment 1 is executed 100 times and the width of the high resistance stabilization writing voltage pulse is 10 µs.
Figure 10G:
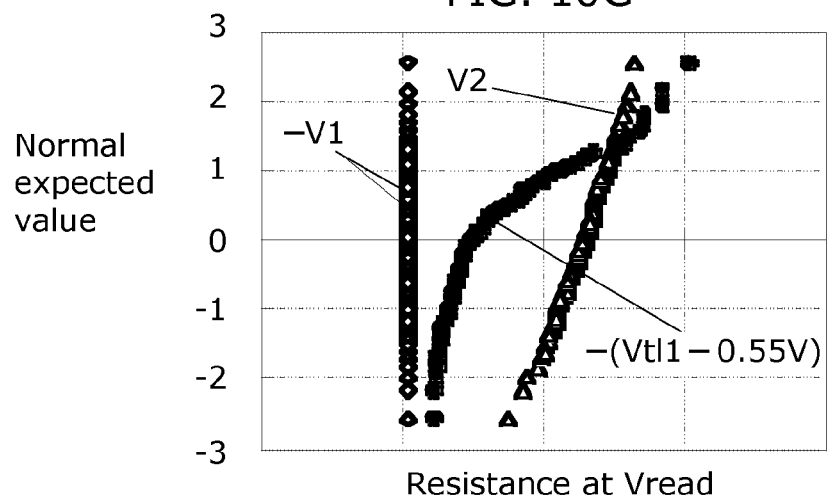
FIG. 10G is a graph illustrating the normal expected value distribution of resistance values when the high resistance writing method according to Embodiment 1 is executed 100 times and the width of the high resistance stabilization writing voltage pulse is 10 μs.
Figure 11A:
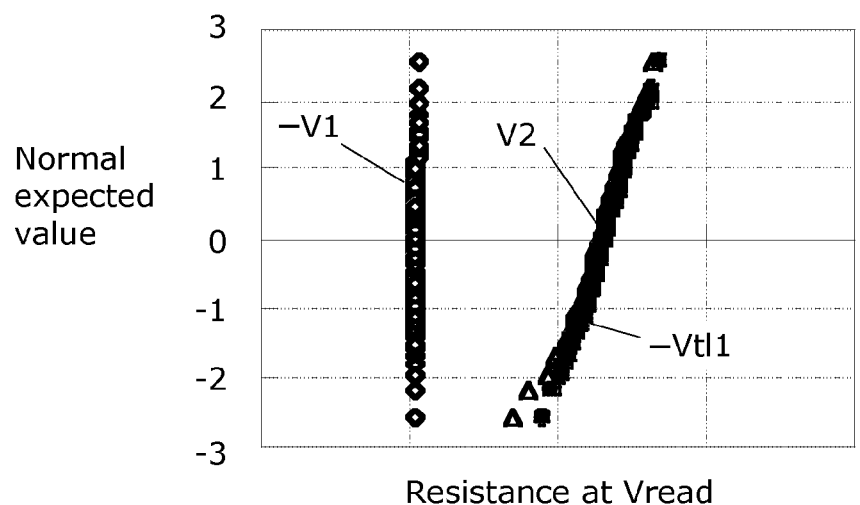
FIG. 11A is a graph illustrating the normal expected value distribution of resistance values when the high resistance writing method according to Embodiment 1 is executed 100 times and the width of the high resistance stabilization writing voltage pulse is 100 μs.
Figure 11E:
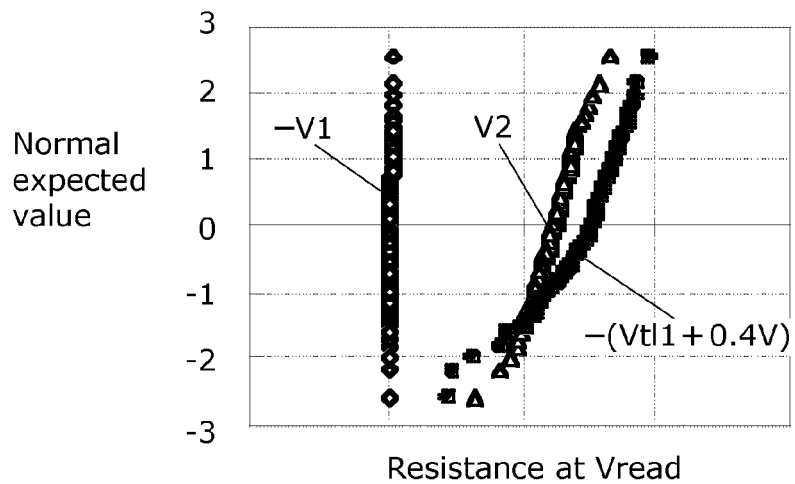
FIG. 11E is a graph illustrating the normal expected value distribution of resistance values when the high resistance writing method according to Embodiment 1 is executed 100 times and the width of the high resistance stabilization writing voltage pulse is 100 μs.
Figure 11F:
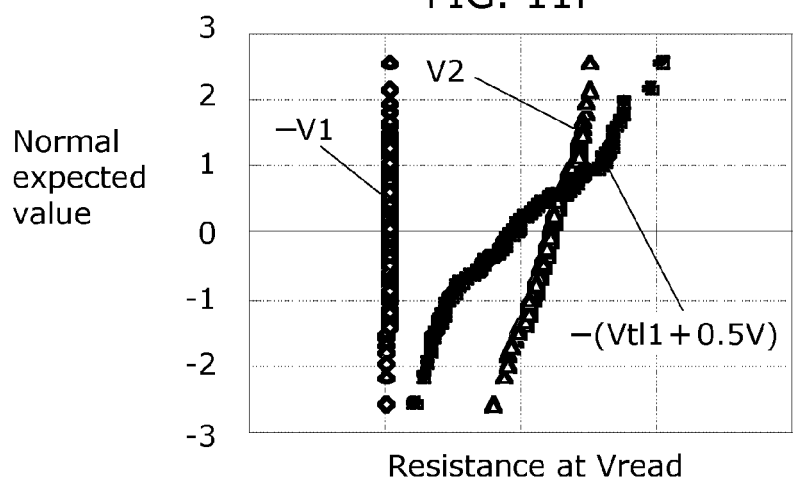
FIG. 11F is a graph illustrating the normal expected value distribution of resistance values when the high resistance writing method according to Embodiment 1 is executed 100 times and the width of the high resistance stabilization writing voltage pulse is 100 μs.
Figure 11G:
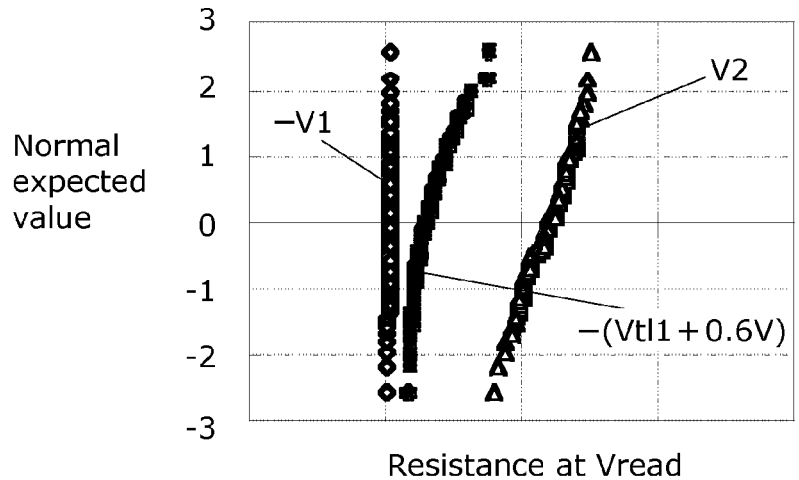
FIG. 11G is a graph illustrating the normal expected value distribution of resistance values when the high resistance writing method according to Embodiment 1 is executed 100 times and the width of the high resistance stabilization writing voltage pulse is 100 μs.
Figure 12A:
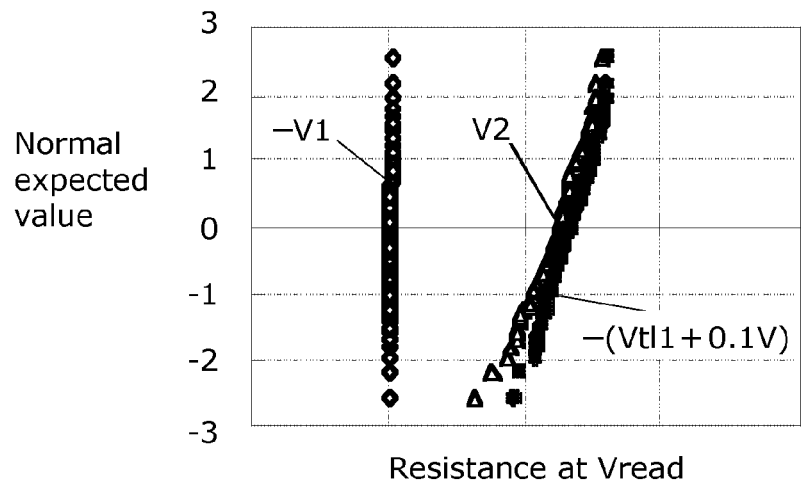
FIG. 12A is a graph illustrating the normal expected value distribution of resistance values when the high resistance writing method according to Embodiment 1 is executed 100 times and the width of the high resistance stabilization writing voltage pulse is 1 ms.
Figure 12B:
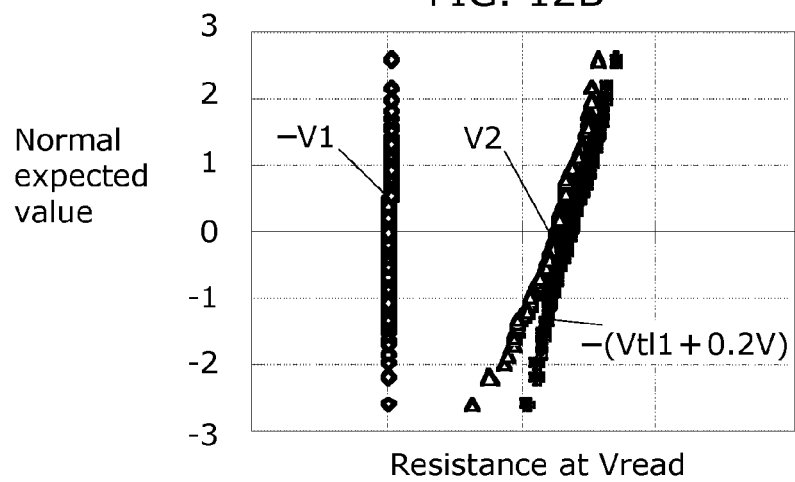
FIG. 12B is a graph illustrating the normal expected value distribution of resistance values when the high resistance writing method according to Embodiment 1 is executed 100 times and the width of the high resistance stabilization writing voltage pulse is 1 ms.
Figure 12C:
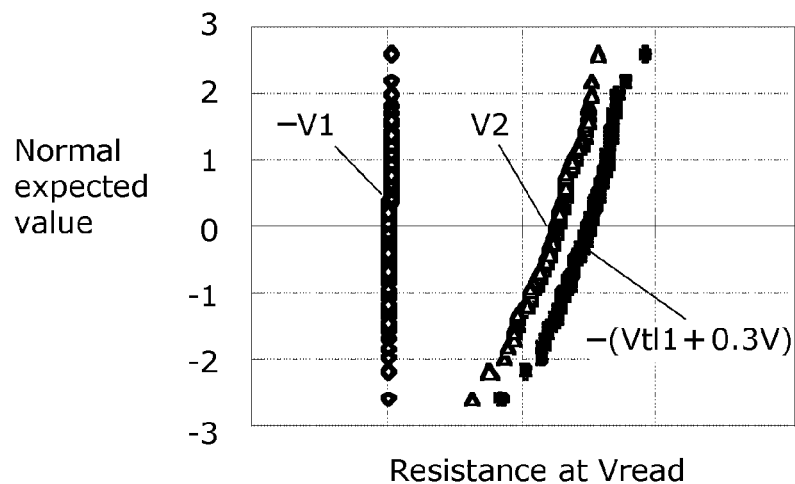
FIG. 12C is a graph illustrating the normal expected value distribution of resistance values when the high resistance writing method according to Embodiment 1 is executed 100 times and the width of the high resistance stabilization writing voltage pulse is 1 ms.
Figure 12D:
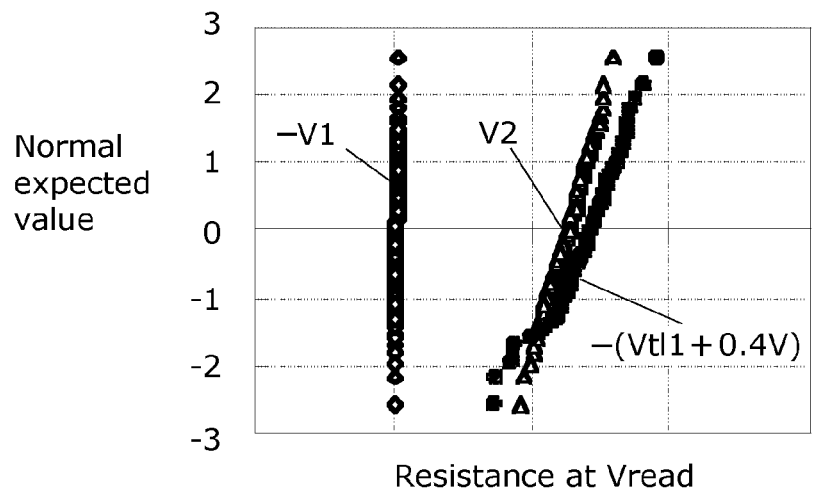
FIG. 12D is a graph illustrating the normal expected value distribution of resistance values when the high resistance writing method according to Embodiment 1 is executed 100 times and the width of the high resistance stabilization writing voltage pulse is 1 ms.
Figure 12E:
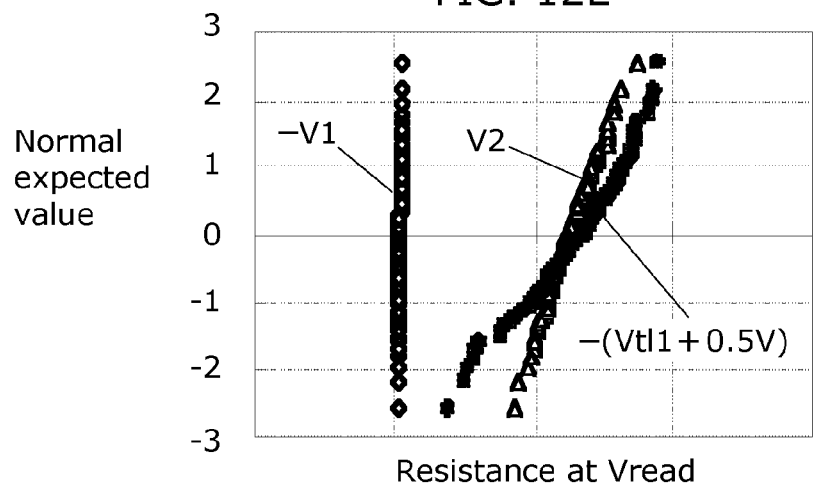
FIG. 12E is a graph illustrating the normal expected value distribution of resistance values when the high resistance writing method according to Embodiment 1 is executed 100 times and the width of the high resistance stabilization writing voltage pulse is 1 ms.
Figure 12F:
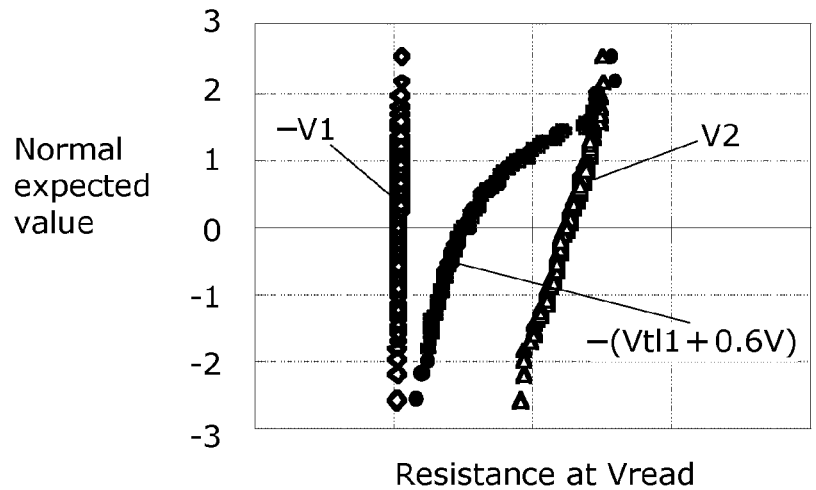
FIG. 12F is a graph illustrating the normal expected value distribution of resistance values when the high resistance writing method according to Embodiment 1 is executed 100 times and the width of the high resistance stabilization writing voltage pulse is 1 ms.
Figure 12G:
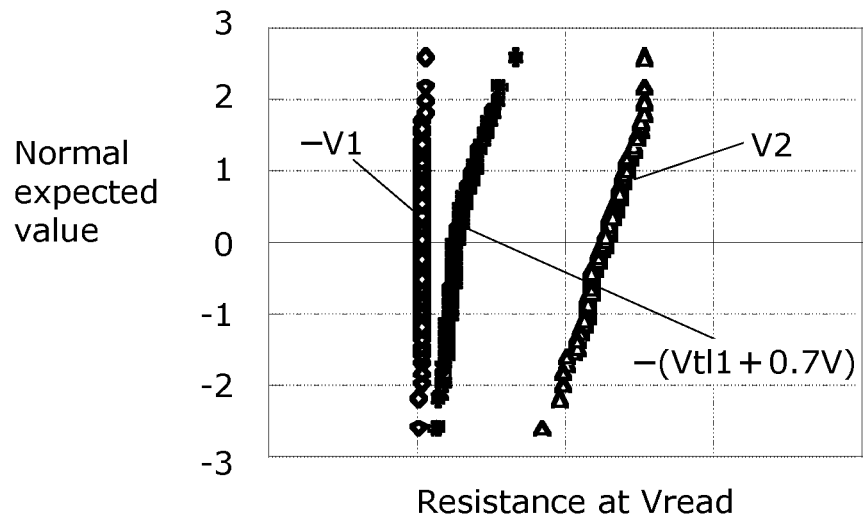
FIG. 12G is a graph illustrating the normal expected value distribution of resistance values when the high resistance writing method according to Embodiment 1 is executed 100 times and the width of the high resistance stabilization writing voltage pulse is 1 ms.

FIG. 7 is a graph showing the resistance-change characteristics when the nonvolatile memory element according to Embodiment 1 is caused to change from the high resistance state RH to the low resistance state RL by voltage sweeping. In FIG. 7, the horizontal axis direction is the negative voltage direction.

FIG. 7 illustrates the resistance value of the nonvolatile memory element 100 when, in the case where the nonvolatile memory element 100 is in a normal first high resistance state RH, a negative voltage pulse is applied (voltage sweeping) to the nonvolatile memory element 100 while the amplitude of the negative voltage pulse is increased up to −V1 using a predetermined step voltage.

Here, as in the previous description, the pulse width of the negative pulse is 200 ns, and the resistance value is obtained by applying Vread to the nonvolatile memory element 100 after application of the respective pulses, and detecting the current flowing in the nonvolatile memory element 100.

Looking at FIG. 7, the resistance value of the first high resistance state RH of the nonvolatile memory element 100 does not change much when the applied voltage of the negative voltage pulse is within a range of 0 to −Vtl1. However, it can be seen that when the applied voltage goes from −Vtl1 to −Vtl, the resistance value increases from the first high resistance state RH to a second high resistance state RH1.

It is presumed that the resistance value increased because the oxygen ions or electrons generated at the time of positive voltage pulse application were once again trapped in the oxygen defect in the second transition metal oxide layer 3b due to the application of the negative voltage pulse. The capture of electrons can also occur when the variable resistance layer 3 is configured of only the second transition metal oxide layer 3b (that is, a single layer).

In addition, it can be seen that, when the amplitude of the applied voltage of the negative voltage pulse becomes larger than Vtl, the resistance value decreases from the second high resistance state RH1 to the low resistance state RL. It should be noted that, in this embodiment, −Vtl1 corresponds to the applied voltage at the rising point where the resistance value changes from a flat region in which the resistance value substantially does not change, to a region in which the resistance value increases, in the case where the voltage applied to the nonvolatile memory element 100 in the first high resistance state RH is reduced (the case where the amplitude of the applied voltage of the negative voltage pulse is increased).

From the foregoing, it can be seen that, by applying an appropriate negative voltage pulse (a voltage pulse whose amplitude is larger than Vtl1 and smaller than Vtl) having an absolute value smaller than the low resistance threshold voltage (−Vtl in FIG. 7) for changing the resistance state of the nonvolatile memory element 100 from the high resistance state to the low resistance state after causing the resistance value of the nonvolatile memory element 100 to change from the low resistance state to the high resistance state, the nonvolatile memory element 100 can be made to change to the second high resistance state RH1 which is an even higher resistance than the normal first high resistance state RH. Hereafter, the writing to the second high resistance state RH1 using negative voltage pulses shall be called high resistance stabilization writing. It should be noted that there are also instances where the high resistance stabilization writing is called the second high resistance writing step.

From the foregoing description, the high resistance stabilization writing (step of changing the variable resistance layer 3 to the high resistance state) can be expressed as follows. Specifically, the step of changing the variable resistance layer 3 to the high resistance state includes: a step of changing the variable resistance layer 3 to a high resistance state (resistance value RH) which has a higher resistance value than the low resistance state RL (resistance value RL) by applying, to the second electrode 2, a second voltage which is positive with respect to the first electrode 1; and a step of changing the variable resistance layer 3 to a high resistance state indicated by a resistance value RH1 that is larger than the resistance value RH, by applying, to the second electrode 2, a third voltage which is negative with respect to the first electrode 1 and is smaller than the absolute value of the threshold voltage at which the variable resistance layer 3 changes from the high resistance state to the low resistance state, after the positive second voltage is applied through the step of changing the resistance value of the variable resistance layer 3 to the resistance value RH which is larger than the resistance value RL.

Here, the third voltage is an appropriate negative voltage pulse having an absolute value smaller than the low resistance threshold voltage (−Vtl in FIG. 7). More specifically, the third voltage is a voltage pulse having an amplitude absolute value that is larger than Vtl1 and smaller than Vtl. It should be noted that, based on FIG. 7, the voltage pulse −Vtl1 can also be expressed as the threshold voltage at which the resistance value begins to increase from the first high resistance state RH (resistance value RH) to the second high resistance state RH1 (resistance value RH1). Furthermore, with regard to the third voltage, when the pulse width of the amplitude is made larger, the absolute value of the amplitude may be made smaller, as described later.

Next, a study was performed as to whether or not there was a pulse width dependency within the range of the voltage value of the voltage pulse of the high resistance stabilization writing which is a characteristic feature of the method of writing into the nonvolatile memory element 100 in this embodiment. The results shall be described below.

FIG. 8A to FIG. 8G are graphs illustrating the normalized expected value distribution of resistance values when the high resistance writing method (performing the second high resistance writing after the first high resistance writing) according to Embodiment 1 is executed 100 times and the width of the high resistance stabilization writing voltage pulse is 200 ns. In the same manner, FIG. 9A to FIG. 9G are graphs illustrating the normalized expected value distribution of resistance values when the high resistance writing method according to Embodiment 1 is executed 100 times and the width of the high resistance stabilization writing voltage pulse is 1 μs. FIG. 10A to FIG. 10G are graphs illustrating the normalized expected value distribution of resistance values when the high resistance writing method according to Embodiment 1 is executed 100 times and the width of the high resistance stabilization writing voltage pulse is 10 μs. FIG. 11A to FIG. 11G are graphs illustrating the normalized expected value distribution of resistance values when the high resistance writing method according to Embodiment 1 is executed 100 times and the width of the high resistance stabilization writing voltage pulse is 100 μs. FIG. 12A to FIG. 12G are graphs illustrating the normalized expected value distribution of resistance values when the high resistance writing method according to Embodiment 1 is executed 100 times and the width of the high resistance stabilization writing voltage pulse is 1 ms. In each of the graphs, the resistance values on the horizontal axis are represented using log scale.

Specifically, FIG. 8A to FIG. 8G, FIG. 9A to FIG. 9G, FIG. 10A to FIG. 10G, FIG. 11A to FIG. 11G, and FIG. 12A to FIG. 12G each show graphs of the normalized expected value distribution of results values after the following three pulses are applied in sequence 100 times: 1) a negative low resistance writing voltage pulse (amplitude: V1, pulse width: 200 ns, and resistance value after application denoted by white squares); 2) a positive first high resistance writing voltage pulse (amplitude: V2, pulse width: 200 ns, and resistance value after application denoted by white triangles; and 3) a negative high resistance stabilization writing voltage pulse (amplitude: V3 and resistance value after application denoted by black squares). Furthermore, the measurement of the resistance value of the nonvolatile memory element 100 is calculated by applying a positive reading voltage Vread to the nonvolatile memory element 100 after application of the respective pulses, and detecting the current flowing in the nonvolatile memory element 100.

Here, the pulse width of the high resistance stabilization writing voltage pulse is set as: 200 ns in FIG. 8A to FIG. 8G; 10 μs in FIG. 10A to FIG. 10G; 100 μs in FIG. 11A to FIG. 11G; and 1 ms in FIG. 12A to FIG. 12G.

Furthermore, in FIG. 8A, FIG. 9A, FIG. 10A, FIG. 11A, and FIG. 12A, the amplitude V3 of the high resistance stabilization writing voltage pulse is set to Va. Furthermore, in FIG. 8B, FIG. 9B, FIG. 10B, FIG. 11B, and FIG. 12B, the amplitude V3 of the high resistance stabilization writing voltage pulse is set to Vb. In the same manner, in FIG. 8C to FIG. 12C, V3=Vc; in FIG. 8D to FIG. 12D, V3=Vd; in FIG. 8E to 12 E, V3=Ve; in FIG. 8F to FIG. 12F, V3=Vf; and in FIG. 8G to FIG. 12G, V3=Vg.

Here, each of Va, Vb, Vc, Vd, Ve, Vf, and Vg is a constant value, and the relationship with Vtl1 is as shown in Table 1. Furthermore, FIG. 13 is a graph showing the relationship between the respective pulse widths and the values of Vtl1 and Vtl according to Embodiment 1.

Figure 13:
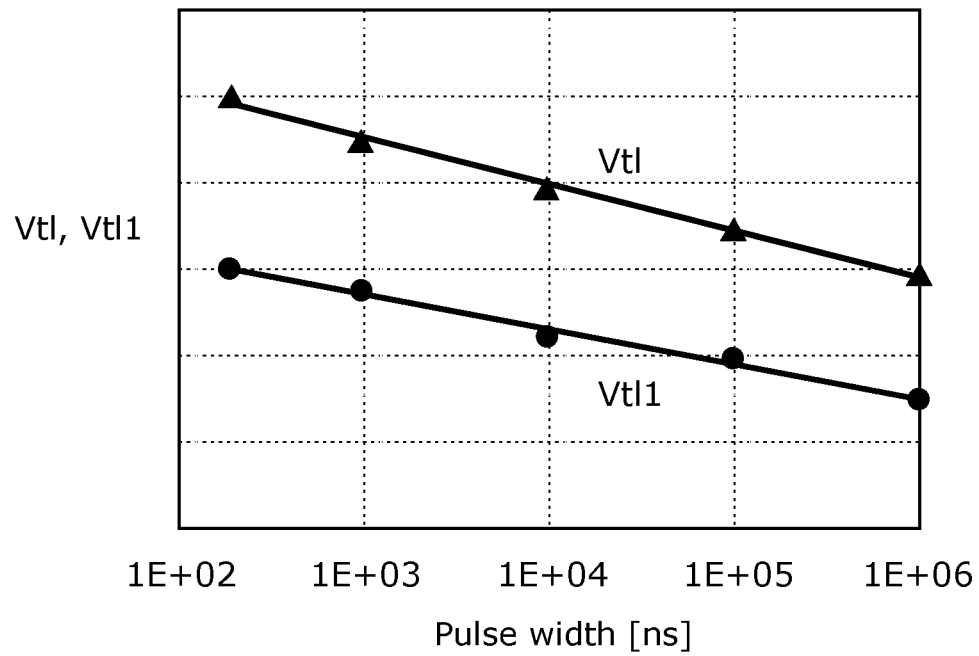
FIG. 13 is a graph showing the relationship between the respective pulse widths and the values of Vtl1 and the values of Vtl according to Embodiment 1.

As shown in FIG. 13, the values of Vtl1 and Vtl decrease as the pulse width increases, and thus, even with the same voltage pulse width, the relationship with Vtl1 differs. In Table 1, the values of Vtl1 for the respective pulse widths are different as shown in FIG. 13.

TABLE 1

| | 200 ns | 1 μs | 10 μs | 100 μs | 1 ms |
|---|---|---|---|---|---|
| Va | Vtl1 − 0.2 | Vtl1 − 0.15 | Vtl1 − 0.05 | Vtl1 | Vtl1 + 0.1 |
| Vb | Vtl1 − 0.1 | Vtl1 − 0.05 | Vtl1 + 0.05 | Vtl1 + 0.1 | Vtl1 + 0.2 |
| Vc | Vtl1 | Vtl1 + 0.05 | Vtl1 + 0.15 | Vtl1 + 0.2 | Vtl1 + 0.3 |
| Vd | Vtl1 + 0.1 | Vtl1 + 0.15 | Vtl1 + 0.25 | Vtl1 + 0.3 | Vtl1 + 0.4 |
| Ve | Vtl1 + 0.2 | Vtl1 + 0.25 | Vtl1 + 0.35 | Vtl1 + 0.4 | Vtl1 + 0.5 |
| Vf | Vtl1 + 0.3 | Vtl1 + 0.35 | Vtl1 + 0.45 | Vtl1 + 0.5 | Vtl1 + 0.6 |
| Vg | Vtl1 + 0.4 | Vtl1 + 0.45 | Vtl1 + 0.55 | Vtl1 + 0.6 | Vtl1 + 0.7 |

First, looking at FIG. 8A to FIG. 8G, in the case where the pulse width of the high resistance stabilization writing voltage pulse is 200 ns, it can be seen that there is almost no difference between the resistance value distributions of the resistance value after the high resistance stabilization writing and the resistance value after the first high resistance writing, when the amplitude V3 of the negative high resistance stabilization writing voltage pulse is between (Vtl1−0.2 V) and Vtl1 inclusive. Furthermore, when the amplitude V3 of the high resistance stabilization writing voltage pulse is increased to between (Vtl1+0.1 V) and (Vtl1+0.2 V) inclusive, it can be seen that due to the high resistance stabilization writing, there is improvement among the variation of resistance values after the first high resistance writing, particularly in the resistance values that are low which have attained a higher resistance state. When the amplitude V3 of the high resistance stabilization writing voltage pulse is further increased to (Vtl+0.3), it can be verified that the resistance values increase as a whole due to the high resistance stabilization writing. However, when the amplitude V3 of the high resistance stabilization writing voltage pulse is (Vtl1+0.4 V), some decreasing resistance values appear compared to after the high resistance writing, and the variation in the resistance value distribution becomes big. This is thought to be due to the occurrence of partial changing to low resistance.

Therefore, when the pulse width of the high resistance stabilization writing voltage pulse is 200 ns, the amplitude of the negative high resistance stabilization writing voltage pulse may be set to be between (Vtl1+0.1 V) and (Vtl1+0.3 V) inclusive.

Next, FIG. 9A to FIG. 9G, FIG. 10A to FIG. 10G, FIG. 11A to FIG. 11G, and FIG. 12A to FIG. 12G shall be examined in the same manner.

Furthermore, in the case where the pulse width of the high resistance stabilization writing voltage pulse is 1 μs (FIG. 9A to FIG. 9G), it can be seen from FIG. 9B to FIG. 9E that, when the amplitude V3 of the high resistance stabilization writing voltage pulse is between (Vtl1+0.5 V) and (Vtl1+0.25 V) inclusive, variation can be improved towards the high resistance-side compared to after the first high resistance writing, or resistance as a whole can be increased, by applying the high resistance stabilization writing voltage pulse −V3.

In the case where the pulse width of the high resistance stabilization writing voltage pulse is 10 μs (FIG. 10A to FIG. 10G), it can be seen from FIG. 10A to FIG. 10E that, when the amplitude V3 of the high resistance stabilization writing voltage pulse is between (Vtl1+0.5 V) and (Vtl1+0.35 V) inclusive, variation can be improved towards the high resistance-side compared to after the first high resistance writing, or resistance as a whole can be increased, by applying the high resistance stabilization writing voltage pulse −V3.

Furthermore, in the case where the pulse width of the high resistance stabilization writing voltage pulse is 100 μs (FIG. 11A to FIG. 11G), it can be seen from FIG. 11A to FIG. 11D that, when the amplitude V3 of the high resistance stabilization writing voltage pulse is between (Vtl1+0.1 V) and (Vtl1+0.3 V) inclusive, variation can be improved towards the high resistance-side compared to after the first high resistance writing, or resistance as a whole can be increased, by applying the high resistance stabilization writing voltage pulse −V3.

In the case where the pulse width of the high resistance stabilization writing voltage pulse is 1 ms (FIG. 12A to FIG. 12G), it can be seen that, when the amplitude V3 of the high resistance stabilization writing voltage pulse is between (Vtl1+0.1 V) and (Vtl1+0.3 V) inclusive, variation can be improved towards the high resistance-side compared to after the first high resistance writing, or resistance as a whole can be increased, by applying the high resistance stabilization writing voltage pulse −V3.

As described above, it can be seen that, as the pulse width of the high resistance stabilization writing voltage pulse increases, the effect of improvement in the variation in the high resistance state is produced even when the amplitude of the high resistance stabilization writing voltage pulse is small, and the effect of the improvement in the variation in the high resistance state is thought to be related to the amount of charge injected to the second transitional metal oxide layer 3*b*. Specifically, the lower limit value of the amplitude of the high resistance stabilization writing voltage pulse for which there is the effect of improvement in the variation in the high resistance state may be a value that is smaller as the pulse width of the high resistance stabilization writing voltage pulse is larger.

On the other hand, it can be seen that there is almost no change in distribution in the low resistance state under any of the foregoing conditions. From this, it can be understood that, compared to after the first high resistance writing, the variation in the resistance values of the second high resistance state can be improved towards the high resistance-side and the resistance-change window can be enlarged by performing the high resistance stabilization writing.

Furthermore, it can be seen from FIG. 8A to FIG. 8G, FIG. 9A to FIG. 9G, FIG. 10A to FIG. 10G, FIG. 11A to FIG. 11G, and FIG. 12A to FIG. 12G that a larger pulse width for the high resistance stabilization writing voltage pulse allows for a higher resistance state even when the amplitude of the high resistance stabilization writing voltage pulse is small. However, conversely, since the absolute value Vtl of the low resistance threshold voltage also becomes small when the pulse width of the high resistance stabilization writing voltage pulse is large, the amplitude of the high resistance stabilization writing voltage pulse cannot be made too high. The absolute value Vtl of the low resistance threshold voltage is determined by the resistance value after the first high resistance writing, and therefore by the resistance value of the low resistance state, the condition for the first high resistance writing voltage pulse, the condition for the low resistance writing voltage pulse, the thickness and composition of the first and second transition metal oxide layers.

As described thus far, according to this embodiment, it is possible to realize a variable resistance element writing method capable of suppressing variation of the high resistance state and ensuring a maximum resistance-change window.

Specifically, even though there are cases where the variable resistance element is changed to a sub-high resistance state, in which the change to high resistance is insufficient, when only the first high resistance writing is performed on the variable resistance element, the variable resistance element can be reliably changed to the high resistance state by performing the second high resistance writing (high resistance stabilization writing) for high resistance stabilization, after the first high resistance writing. This makes it possible to realize a variable resistance nonvolatile memory element writing method capable of suppressing variation of the high resistance state and ensuring a maximum resistance-change window in the high resistance-side.

It should be noted that although description is carried out in this embodiment using an example in which the high resistance stabilization writing is performed with one pulse, the high resistance stabilization writing is not limited to such. By selecting the appropriate pulse width and pulse voltage, the high resistance stabilization writing may be performed using plural pulses. For example, the voltage may be changed continuously from a voltage having a small amplitude to a voltage having a big amplitude.

Furthermore, although this embodiment describes the case where the resistance value is measured after application of the first high resistance writing voltage pulse, in order to verify results, timing measurement is not limited to such. For example, the first high resistance writing voltage pulse and a negative high resistance stabilization writing voltage pulse may be applied in succession, and the resistance value may be measured after applying the first high resistance writing voltage pulse, and additional writing of the negative high resistance stabilization writing voltage pulse may be performed when the resistance value is not sufficiently high.

Modification

Embodiment 1 describes the case of performing writing to attain a higher resistance state by applying a negative high resistance stabilization writing voltage pulse after applying the first high resistance writing voltage pulse, and performing resistance measurement (data reading) using a positive reading voltage Vread. Here, by performing data reading (resistance measurement) using a negative voltage instead of a positive voltage, it is thought that the negative data reading and the high resistance stabilization writing voltage application can be combined. In view of this, this modification shall describe an example of substitution by performing data reading using a negative reading voltage in place of the second high resistance writing for high resistance stabilization.

Figure 14:
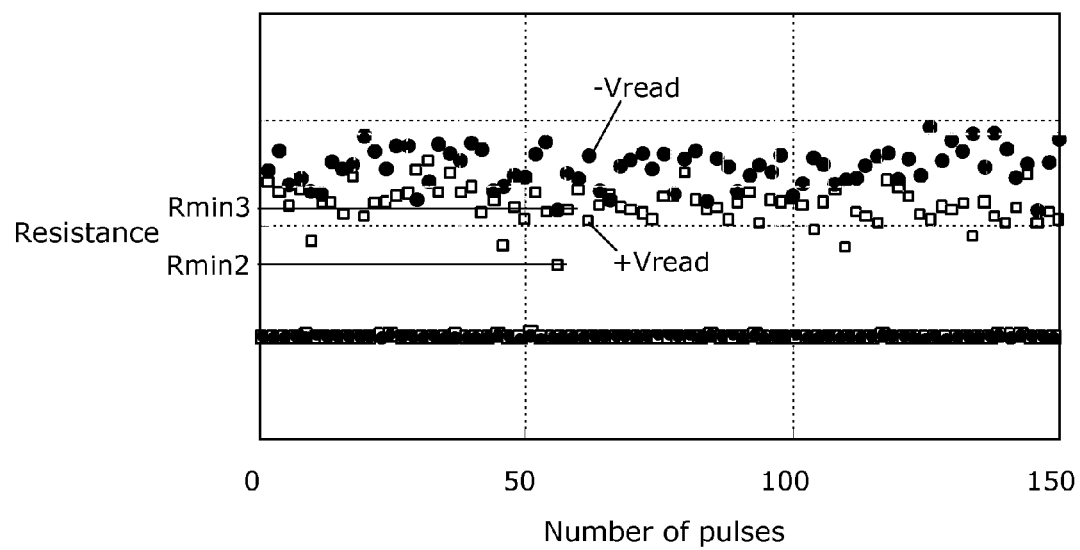
FIG. 14 is a graph showing the resistance change when a writing method according to a modification of Embodiment 1 is performed on a nonvolatile memory element.
Figure 15:
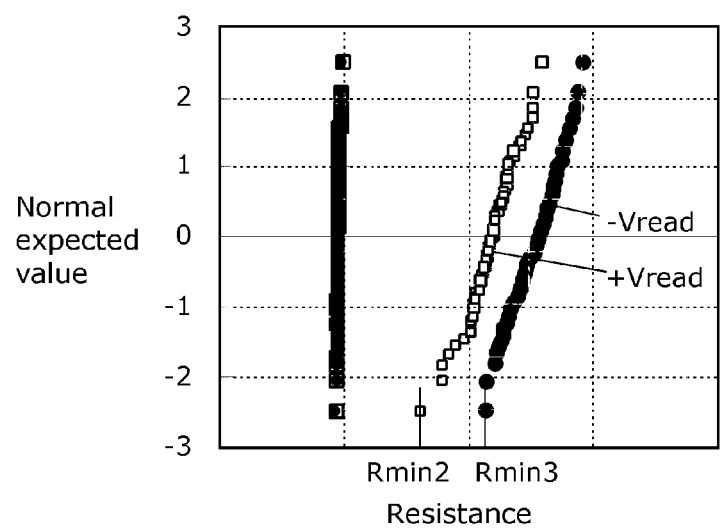
FIG. 15 is a graph illustrating the normalized expected value distribution of the resistance value during the resistance change when the writing method according to the modification of Embodiment 1 is performed on the nonvolatile memory element.

FIG. 14 is a graph showing the resistance change when the writing method according to the modification of Embodiment 1 is performed on the nonvolatile memory element. FIG. 15 is a graph showing the normalized expected value distribution of the resistance value during the resistance change when the writing method according to the modification of Embodiment 1 is performed on the nonvolatile memory element.

In FIG. 14 illustrates the resistance change when a positive high resistance writing voltage (amplitude: V2) and a negative low resistance writing voltage (amplitude: V1) are alternately applied to the nonvolatile memory element 100 as shown in FIG. 1, and −Vread is set as a reading voltage having a smaller amplitude than the low resistance threshold voltage −Vtl1. The horizontal axis in FIG. 14 denotes the number of applications of the high resistance writing voltage or the low resistance writing voltage, that is, the respective voltage pulse applications (number of pulses), and the vertical axis denotes the resistance value of the nonvolatile memory element 100. FIG. 15 illustrates the normalized expected value distribution of the resistance values at the respective times.

It should be noted that, here, a fixed resistance having a resistance value R is used as an element representing the function of the current control element 20. Furthermore, the pulse width of the voltage applied to the nonvolatile memory element 100 is 200 ns.

Furthermore, FIG. 14 and FIG. 15 also show, as a comparative example, the measurement results when alternating positive and negative pulses are applied according to the conventional writing method and resistance measurement (data reading) is performed using a positive voltage +Vread which is smaller than the high resistance threshold voltage. In FIG. 14 and FIG. 15, a black circle symbol "•" shows the measurement results for this modification where the reading voltage is −Vread, and a white square symbol "☐" shows the measurement results of the comparative example where the reading voltage is +Vread.

In FIG. 14 and FIG. 15, when the case of the modification in which the reading voltage is −Vread and the case of the comparative example in which the reading voltage is +Vread are compared, it can be seen that there is almost no difference in the resistance values in the low resistance state. In contrast, for the resistance values in the high resistance state, it can be seen that, with respect to the minimum value Rmin2 for the comparative example where the reading voltage is +Vread, the minimum value for the modification in which the reading voltage is −Vread is Rmin3 which is several times larger.

It is thought that this is because the same change as in the high resistance stabilization writing described in Embodiment 1 occurs simultaneously with the reading operation.

According to the foregoing description, subsequent to the first high resistance writing in which a second voltage which is positive with respect to the first electrode 1 is applied to the second electrode 2, it is also possible to perform the second high resistance writing to change the variable resistance layer 3 to a higher resistance state (second high resistance state) by performing at least the reading in the first high resistance state using a negative voltage. Accordingly, it is possible to obtain a resistance-change window that is larger than that in the case of reading with a positive voltage as in the comparative example, and thus more stable operation can be realized.

Embodiment 2

Although Embodiment 1 gives an example of a basic configuration in which the memory cell is limited to one in order to facilitate description, the present invention can be realized as a nonvolatile memory device in which, in actuality, plural memory cells are arranged in an array. In Embodiment 2, a specific example of such device shall be described.

Figure 16:
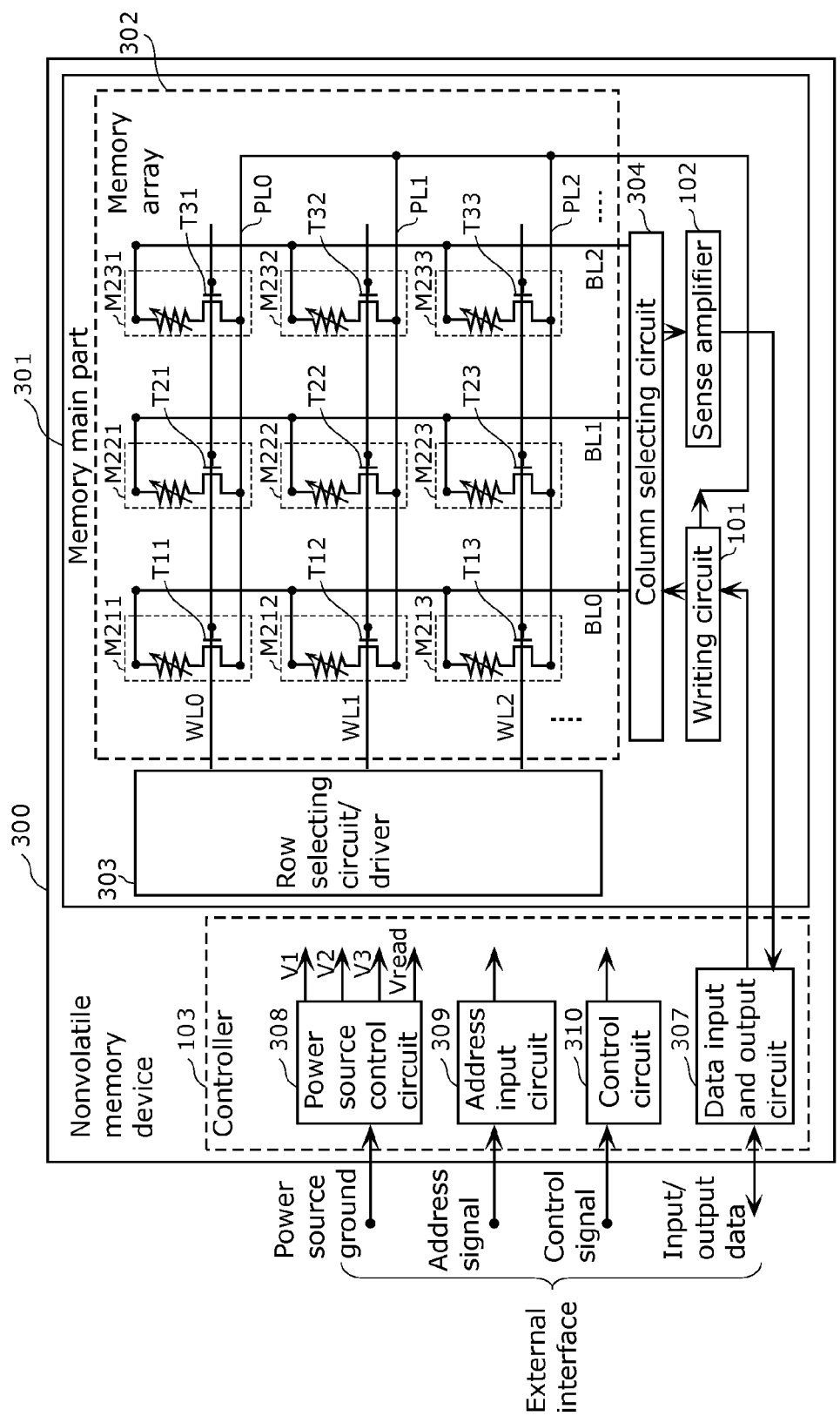
FIG. 16 is a block diagram showing a configuration for the case where the nonvolatile memory device according to Embodiment 1 has memory cells in a specific array structure.

FIG. 16 is a block diagram showing a configuration for the case where the nonvolatile memory device according to Embodiment 1 has memory cells in a specific array structure.

As shown in FIG. 16, a nonvolatile memory device 300 according to this embodiment includes a memory main part 301 above a semiconductor substrate (not shown in the figure). The memory main part 301 includes a memory cell array 302, a row selecting circuit/driver 303, a column selecting circuit 304, a writing circuit 101 for performing the writing of information, and a sense amplifier 102 which detects the resistance value of a memory cell selected from the memory cell array 302 and determines whether data indicates "1" or "0". Furthermore, the nonvolatile memory device 300 further includes a power source control circuit 308 which generates plural power sources necessary for writing data to a selected memory cell, an address input circuit 309 which receives an address signal inputted from an external source, a control circuit 310 which controls the operation of the memory main part 301 based on a control signal inputted from an outside source, and a data input and output circuit 307 which performs inputting and outputting of input and output data.

The memory cell array 302 includes: plural first lines which are formed above the semiconductor substrate and extend parallel to one another in a first direction in a first plane which is roughly parallel to the upper surface of the semiconductor substrate (Word lines WL0, WL1, WL2, . . . , in the example in FIG. 16. Hereafter referred to as "word lines WL0, WL1, WL2, . . . " for convenience of description); plural second lines which are formed above the semiconductor substrate, extend parallel to one another in a second direction in a second plane parallel to the first plane, and three-dimensionally cross with the first lines (Bit lines BL0, BL1, BL2, . . . , in the example in FIG. 16. Hereafter referred to as "bit lines BL0, BL1, BL2, ..." for convenience of description); and memory cells M211, M212, M213, M221, M222, M223, M231, M232, M233 each provided for a corresponding one of the three-dimensional cross-points of the word lines WL0, WL1, WL2, ... and the bit lines BL0, BL1, BL2, ... (hereafter referred to as "memory cells M211, M212, ..."). Each of the memory cells M211, M212, ... include the memory cell (the nonvolatile memory element 100) shown in FIG. 1. The word lines WL0, WL1, WL2, ... are connected to the gates of respective selection transistors (hereafter referred to simply as "transistors") T11, T12, T13, T21, T22, T23, T31, T32, T33, ... (hereafter referred to as "transistors T11, T12, ...") included in the corresponding one of the memory cells M211, M212, ..... The bit lines BL0, BL1, BL2, ... are connected to one end of the memory cell 105a included in each of the memory cells M211, M212, ....

The variable resistance element 10 operates as a nonvolatile memory element inside the memory cells M211, M212, ..... The memory cells M211, M212, ... are called 1T1R memory cells because each includes one transistor and one variable resistance memory 10. Furthermore, the memory cell array 302 includes plural plate lines PL0, PL1, PL2, ... arranged in parallel with the word lines WL0, WL1, WL2, ..... The plate lines PL0, PL1, PL2, ... are connected to the other end of the memory cell (nonvolatile memory element 100) included in each of the memory cells M211, M212, ....

It should be noted that although, here, the plate lines are arranged in parallel with the word lines, the plate lines may be arranged in parallel with the bit lines. Furthermore, although the source lines of the transistors, as a plate lines, provide a common potential to the connected transistor, it is acceptable to have a source line selecting circuit/driver having the same configuration as the row selecting circuit/driver, and drive a selected source line and an non-selected source line using different voltages (including polarities).

Here, the nonvolatile memory element included in each of the memory cells M211, M212, ... includes a variable resistance layer which includes a transition metal oxide such as an oxygen-deficient tantalum oxide, and the like, as described earlier. More specifically, the nonvolatile memory element included in each of the memory cells M211, M212, ... includes: the first electrode 1 which is the lower electrode of the variable resistance element 10 shown in FIG. 1; the second electrode 2 which is the upper electrode of the variable resistance element 10 shown in FIG. 1; and the variable resistance layer 3 of the variable resistance element 10 shown in FIG. 1.

The selection transistors T11, T12, T13, ... in the memory array 302 in FIG. 16 are exemplified using n-channel MOS transistors. The drains of the transistors T11, T12, T13, ... are connected to the bit line BL0 via the variable resistance element; the drains of the transistors T21, T22, T23, ... are connected to the bit line BL1 via the variable resistance element; and the drains of the transistors T31, T32, T33, ... are connected to the bit line BL2 via the variable resistance element.

Furthermore, the gates of the transistors T11, T21, T31, ... are connected to the word line WL0, the gates of the transistors T12, T22, T32, ... are connected to the word line WL1, and the gates of the transistors T13, T23, T33, ... are connected to the word line WL2.

In addition, the sources of the transistors T11, T21, T31, ... are connected to the plate line PL0, the sources of the transistors T12, T22, T32, ... are connected to the plate line PL1, and the sources of the transistors T13, T23, T33, ... are connected to the plate line PL2. It should be noted that the relationships between the aforementioned drains and sources have been defined for the sake of description, and can obviously be interchanged depending on the voltage-application direction.

The address input circuit 309, under the control of the control circuit 310, receives an address signal from an external circuit (not shown in the figure), and, based on the address signal, outputs a row address signal to the row selecting circuit/driver 303 and outputs a column address signal to the column selecting circuit 304. Here, the address signal is a signal indicating the address of a specific memory cell selected from the memory cells M211, M212, .... Furthermore, the row address signal is a signal indicating a row address out of the address indicated by the address signal, and the column address signal is a signal indicating a column address out of the address indicated by the address signal. It should be noted that the row selecting circuit/driver 303 and the column selecting circuit 304 make up a selecting circuit which selects at least one memory cell which is to be the subject of writing or reading, from the memory array 302.

In an information writing cycle, the control circuit 310 outputs, to the writing circuit 101, a write command signal instructing the application of a voltage for writing, according to the input data inputted to the data input and output circuit 307. On the other hand, in an information reading cycle, the control circuit 310 outputs, to the sense amplifier 102 and the column selecting circuit 304, a read command signal instructing a read operation.

The row selecting circuit/driver 303 receives the row address signal outputted from address input circuit 309, selects one of the word lines WL0, WL1, WL2, ... according to the row address signal, and applies a predetermined voltage to the selected word line.

Furthermore, the column selecting circuit 304 receives the column address signal outputted from address input circuit 309, selects one of the bit lines BL0, BL1, BL2, ... according to the column address signal, and applies a writing voltage or a reading voltage to the selected bit line. At this time, depending on the voltage-application direction, the power source control circuit 308 generates and selectively outputs a ground level (GND: 0 V) voltage or a predetermined applied voltage (the writing voltages −V1, V2, −V3, or the reading voltage Vread), and makes the voltage variable as necessary.

The writing circuit 101 provides a predetermined potential to all the bit lines and plate lines and applies voltage pulses for writing to the bit line selected via the column selecting circuit 304, in accordance with a write command outputted from the control circuit 310.

Furthermore, the sense amplifier 102 is an example of a reading circuit which performs reading of a memory cell selected in the aforementioned reading cycle, and determines whether data indicates "1" or "0" with a time difference in which the applied reading voltage discharges. The output data obtained as a result of the determination is outputted to the external circuit via the data input and output circuit 307.

As described thus far, the present invention is capable of realizing a variable resistance element writing method capable of suppressing variation to the low resistance-side in the high resistance state and ensuring a maximum resistance-change window.

Although the nonvolatile memory element writing methods according to the present invention have been described based on the embodiments, the present invention is not limited to such embodiments. Modifications that can be obtained by executing various modifications to such embodiment that are conceivable to a person of ordinary skill in the art without departing from the essence of the present invention are included in the present invention.

For example, although the variable resistance layer 3 is described as including the first transition metal oxide layer 3a comprising an oxygen-deficient transition metal oxide, and the second transition metal oxide layer 3b comprising a transition metal oxide having a lower degree of oxygen-deficiency than the first transition metal oxide layer 3a, the variable resistance layer 3 is not limited to such configuration. For example, aluminum (Al) may be used in place of the transition metal. Specifically, it is sufficient that the variable resistance layer 3 includes a first metal oxide layer 3a comprising an oxygen-deficient metal oxide, and a second metal oxide layer 3b comprising a metal oxide having a lower degree of oxygen-deficiency than the first metal oxide layer 3a. For example, the variable resistance layer 3 may include a first metal oxide layer comprising an oxygen-deficient tantalum oxide ($TaO_x$), and a second metal oxide layer comprising an Al oxide ($Al_2O_3$) having a lower degree of oxygen-deficiency than the first metal oxide layer.

INDUSTRIAL APPLICABILITY

The nonvolatile memory element writing methods in the present invention are useful as a method for writing into a nonvolatile memory device used in various electronic devices such as personal computers, cellular phones, and so on.

REFERENCE SIGNS LIST

- 1, 936 First electrode
- 2, 932 Second electrode
- 3, 934 Variable resistance layer
- 3a First transition metal oxide layer
- 3b Second transition metal oxide layer
- 10, 930 Variable resistance element
- Current control element
- 100, 940 Nonvolatile memory element
- 300 Nonvolatile memory device
- 301 Memory main part
- 302 Memory cell array
- 303 Driver
- 304 Column selecting circuit
- 307 Data input and output circuit
- 308 Power source control circuit
- 309 Address input circuit
- 310 Control circuit
- 938 MOS transistor

The invention claimed is:

1. A variable resistance nonvolatile memory element writing method for writing data to a variable resistance nonvolatile memory element including a first electrode, a second electrode, and a variable resistance layer which is disposed between the first electrode and the second electrode, is in contact with the first electrode and the second electrode, and reversibly changes between two resistance states consisting of a high resistance state and a low resistance state, according to an electrical signal applied between the first electrode and the second electrode, the variable resistance layer having a stacked structure including: a first metal oxide layer which is in contact with the first electrode and comprises a first metal; and a second metal oxide layer which is in contact with the second electrode and comprises a second metal, and the method comprising:

(a) changing the variable resistance layer to the low resistance state indicated by a resistance value RL, by applying a negative first voltage to the second electrode, the negative first voltage being negative with respect to the first electrode; and (b) changing the variable resistance layer to the high resistance state, wherein step (b) includes:

(i) changing a resistance value of the variable resistance layer to a resistance value RH which is larger than the resistance value RL, by applying a positive second voltage to the second electrode, the positive second voltage being positive with respect to the first electrode; and (ii) changing the variable resistance layer to the high resistance state indicated by a resistance value RH1 which is larger than the resistance value RH, by applying a negative third voltage to the second electrode, after the positive second voltage is applied in step (i), the negative third voltage being negative with respect to the first electrode and being smaller than an absolute value of a threshold voltage for changing the variable resistance layer from the high resistance state to the low resistance state.

2. The variable resistance nonvolatile memory element writing method according to claim 1, wherein a degree of oxygen-deficiency of the first metal oxide layer is higher than a degree of oxygen-deficiency of the second metal oxide layer.

3. The variable resistance nonvolatile memory element writing method according to claim 2, wherein a resistance value of the second metal oxide layer is larger than a resistance value of the first metal oxide layer.

4. The variable resistance nonvolatile memory element writing method according to claim 2, wherein each of the first metal and the second metal is a transition metal.

5. The variable resistance nonvolatile memory element writing method according to claim 2, wherein the first metal and the second metal are a same metal.

6. The variable resistance nonvolatile memory element writing method according to claim 5, wherein the first metal and the second metal comprise tantalum.

7. The variable resistance nonvolatile memory element writing method according to claim 2, wherein the first metal and the second metal are different metals, and a standard electrode potential of the second metal is lower than a standard electrode potential of the first metal.

8. The variable resistance nonvolatile memory element writing method according to claim 1, wherein in step (ii), the negative third voltage is applied after the positive second voltage is applied in step (i), and data is read from the variable resistance nonvolatile memory element using the negative third voltage applied.

9. A variable resistance nonvolatile memory element comprising:

a first electrode;

a second electrode; and a variable resistance layer which is disposed between the first electrode and the second electrode, is in contact with the first electrode and the second electrode, and reversibly changes between two resistance states consisting of a high resistance state and a low resistance state, according to an electrical signal applied between the first electrode and the second electrode, wherein the variable resistance layer:

has a layered structure including: a first metal oxide layer which is in contact with the first electrode and comprises a first metal; and a second metal oxide layer which is in contact with the second electrode and comprises a second metal; and has characteristics of:

changing to the low resistance state indicated by a resistance value RL, according to application of a negative first voltage to the second electrode, the negative first voltage being negative with respect to the first electrode; and changing to the high resistance state indicated by a resistance value RH1 which is larger than the resistance value RH, according to application of a negative third voltage to the second electrode, after a positive second voltage that is positive with respect to the first electrode is applied to the second electrode to change a resistance value of the variable resistance layer to a resistance value RH which is larger than the resistance value RL, the negative third voltage being negative with respect to the first electrode and being smaller than an absolute value of a threshold voltage for changing the variable resistance layer from the high resistance state to the low resistance state.

* * * * *